(12) United States Patent
Steigerwald et al.

(10) Patent No.: US 6,307,218 B1
(45) Date of Patent: *Oct. 23, 2001

(54) ELECTRODE STRUCTURES FOR LIGHT EMITTING DEVICES

(75) Inventors: Daniel A. Steigerwald, Cupertino; Serge L Rudaz; Kyle J. Thomas, both of Sunnyvale; Steven D. Lester, Palo Alto; Paul S. Martin, Pleasanton; William R. Imler, Oakland; Robert M. Fletcher, San Jose; Fred A. Kish, Jr., San Jose; Steven A. Maranowski, San Jose, all of CA (US)

(73) Assignee: LumiLeds Lighting, U.S., LLC, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,928

(22) Filed: Nov. 20, 1998

(51) Int. Cl.⁷ .................................................. H01L 33/00
(52) U.S. Cl. .............................................. 257/99; 257/94
(58) Field of Search ..................... 257/99, 91, 94, 257/96

(56) References Cited

U.S. PATENT DOCUMENTS

| | | | |
|---|---|---|---|
| 3,675,064 | * 7/1972 | Coleman et al. | 313/108 D |
| 4,214,251 | 7/1980 | Schairer | 357/17 |
| 4,495,514 | * 1/1985 | Lawrence et al. | 357/67 |
| 4,864,370 | 9/1989 | Gaw et al. | |
| 5,309,001 | * 5/1994 | Watanabe et al. | 257/99 |
| 5,563,422 | 10/1996 | Nakamura et al. | 257/13 |
| 5,617,446 | * 4/1997 | Ishibashi et al. | 372/96 |
| 5,696,389 | * 12/1997 | Ishikawa et al. | 257/99 |
| 5,698,865 | 12/1997 | Gerner et al. | |
| 5,798,536 | * 8/1998 | Tsutsui | 257/99 |
| 5,981,975 | * 11/1999 | Imhoff | 257/81 |

FOREIGN PATENT DOCUMENTS

| | | |
|---|---|---|
| 19820777A1 | 5/1998 | (DE) . |
| 544512A1 | 11/1992 | (EP) . |
| 0778625A2 | 11/1997 | (EP) . |
| 07030153 | 7/1993 | (JP) . |
| 07288340A | 5/1994 | (JP) . |
| 09097922 | 9/1995 | (JP) . |
| 09181357 | 12/1995 | (JP) . |
| 10163531 | 11/1996 | (JP) . |
| 10209496 | 1/1997 | (JP) . |
| 10209498 | 1/1997 | (JP) . |
| 10209499 | 1/1997 | (JP) . |
| 10275934 | 3/1997 | (JP) . |

* cited by examiner

Primary Examiner—Olik Chaudhuri
Assistant Examiner—Douglas A. Wille
(74) Attorney, Agent, or Firm—Skjerven Morrill MacPherson LLP; Brian D. Ogonowsky; Rachel V. Leiterman

(57) ABSTRACT

A light emitting device includes a heterojunction having a p-type layer and an n-type layer. The n-electrode is electrically connected to the n-type layer while the p-electrode is electrically connected to the p-type layer. The p and n-electrodes are positioned to form a region having uniform light intensity.

36 Claims, 30 Drawing Sheets

US 6,307,218 B1

ELECTRODE STRUCTURES FOR LIGHT EMITTING DEVICES

FIELD OF THE INVENTION

The invention is directed towards the field of light emitting devices, particularly, towards improving the uniformity of light emission and the area efficiency of these devices.

BACKGROUND

The best performing, commercially available AlInGaN light emitting devices (LEDs) are grown on an insulating substrate, e.g. sapphire. Electrodes and their connection pads are usually placed on top of the AlInGaN semiconductor layers of the device.

During operation, current is injected into the LED through external terminals that are tied to the connection pads by wire-bonding (ball or wedge), soldering, or attaching with a conducting adhesive. The p- and n-electrodes inject and spread the current into the respective semiconductor layers. Light is generated when current flows across the p-n junction in the forward direction which causes the recombination of minority carriers at the p-n junction. The intensity, I, of the light emitted by the device under typical operating conditions is proportional to the current density, J, the current per unit area. For a given current density, J, the larger the area of the p-n junction, the greater the intensity, I, generated by the LED.

The p-type semiconductor layers in the AlInGaN materials system are much more resistive than the n-type semiconductor layers. As a result, the current injected at the p-electrode does not spread laterally within the p-type semiconductor and does not spread laterally away from the p-electrode. The current flows from the p-electrode along the shortest path (i.e., usually vertically) across the p-n junction to the n-type semiconductor layers. The current then spreads laterally within the n-type semiconductor layers to reach the n-electrode.

To maximize the area of optical emission, the current must flow across as much of the p-n junction as possible. Consequently, the current must be spread laterally over as large a fraction of the p-type surface as possible. Lateral current spreading may be improved by covering most of the p-type surface with the p-electrode. The p-electrode is then covered totally or in part with a connection pad.

Connection pads are conducting to provide their electrical functionality and must be thick to meet their mechanical functionality. As a result, connection pads are usually metallic. Metal connection pads of the required thickness are opaque. Bonding pads made of transparent, conductive oxides such as ITO (Indium Tim Oxide) have also been used, although not commonly.

A large fraction of the commercially available AlInGaN LEDs extract the light generated within the device through the p-layer. These devices have a compound p-electrode, e.g. a thin, semi-transparent material, for current-spreading that covers most of the p-surface, and a thick opaque connection pad that covers as little of the thin p-electrode as possible while still providing reliable connections for commercial manufacture. An n-electrode is made small as well, to maximize the p-type surface area. A large fraction of the optical emission generated at the p-n junction escapes the device through the portion of the semitransparent p-electrode that is not blocked by the connection pad.

In U.S. Pat. No. 5,563,422, Nakamura, et al., teaches that the n and p connection pads should be diametrically opposed or located at the corners of the device, as shown in FIG. 1. The current flowing vertically down to the n-layer from the area of the p-electrode next to the p-connection pad has to traverse a large horizontal distance in the n-type semiconductor layer to reach the n-electrode once it has passed vertically through the p-n junction. On the other hand, the current flowing vertically down to the n-layer from the area of the p-electrode next to the n-connection pad has to traverse a small horizontal distance in the n-type semiconductor layer to reach the n-electrode. The larger distance adds a significant amount of series resistance in the n-type layer to the former current path, resulting in current crowding at the edge of the thin p-electrode around the n-contact. The most direct current path between the two connection pads is favored strongly over any other paths (such as the ones following the edges of the device), causing the current to crowd in between the connection pads. The non-uniformity in current density increases as the average current density increases, due to the increasing resistive voltage drop in the n-type semiconductor layer. This non-uniformity in current density causes corresponding non-uniformity in light intensity, as shown in FIG. 2. The degree of current density non-uniformity is indicated by a ratio r of the maximum local current density $J_{max}$ to the average current density $J_{ave}$. To estimate this ratio r, one can measure the ratio R of the maximum local light intensity $I_{max}$ to the average light intensity $I_{ave}$, since to first approximation the intensity is proportional to the current density. Such measurements are commonly made using an optical apparatus and imaging the biased LED in near-field conditions. As can be seen from FIG. 2, the ratio R is very high.

The non-uniformity in current density leads to a reduction in the optical and electrical performance of the LED, particularly for conditions of high average current density, and for LEDs that are made with larger dimensions. AlInGaN LEDs characteristically exhibit decreasing efficiency of light emission as the average current density increases due to the mechanism of light emission. Hence, non-uniformity in the current density results in regions operating with lower overall optical efficiency. In addition, as the irreversible degradation in efficiency of light emission increases with increasing current density, non-uniformity in current density increases the overall rate of degradation, a significant concern for commercial LEDs that rely on low rates of degradation for their commercial importance.

An additional drawback to the prior art is that the electrode configurations inefficiently use the substrate area as light-emitting material. For a given average current density J, the larger the area of the p-n junction, the greater the average light intensity I generated by the LED.

SUMMARY OF THE INVENTION

A light-emitting device having an improved electrode structure includes an active region. The active region, e.g. a heterojunction, has a p-type layer and an n-type layer. The n-electrode is electrically connected to the n-type layer while the p-electrode is electrically connected to the p-type layer. The p and n-electrodes are shaped and positioned to provide uniform current density during operation, and to optimize the fraction of the device area that is utilized for light emission. Uniform current density is reached when the ratio of the maximum local current density $J_{max}$ to average current density $J_{ave}$ is less than 3, preferably less than 1.5 to 2. The uniform current density is measured by the ratio of the maximum local intensity $I_{max}$ to the average intensity $I_{ave}$ over the light-emitting region.

Improved electrode structures are achieved by altering three parameters, individually or in combination. The factors are the shape of the device, the shape of the electrodes, and the position of the electrodes. The device may be a sphere, hemisphere, or a solid prism having a cross-sectional area of a polygon, circle, ellipse, or oval. Each electrode may be shaped as a polygon or round shape, e.g. circle. Alternatively, at least one of the two electrodes may be segmented to create multiple regions of uniform current density. The average distance between the electrodes is preferably less than the length of the n and p electrodes.

The improved electrode structure results in an improved "area utilization ratio" A. A is defined as the area ratio of light-emitting p-n junction to the total area of that device, $A_{tot}$. The improved electrode structure can therefore yield higher average intensity $I_{ave}$ over the light-emitting region for a given average current density $J_{ave}$ and a given device cross-sectional area.

DETAILED DESCRIPTION OF THE DRAWINGS

Figure 1:
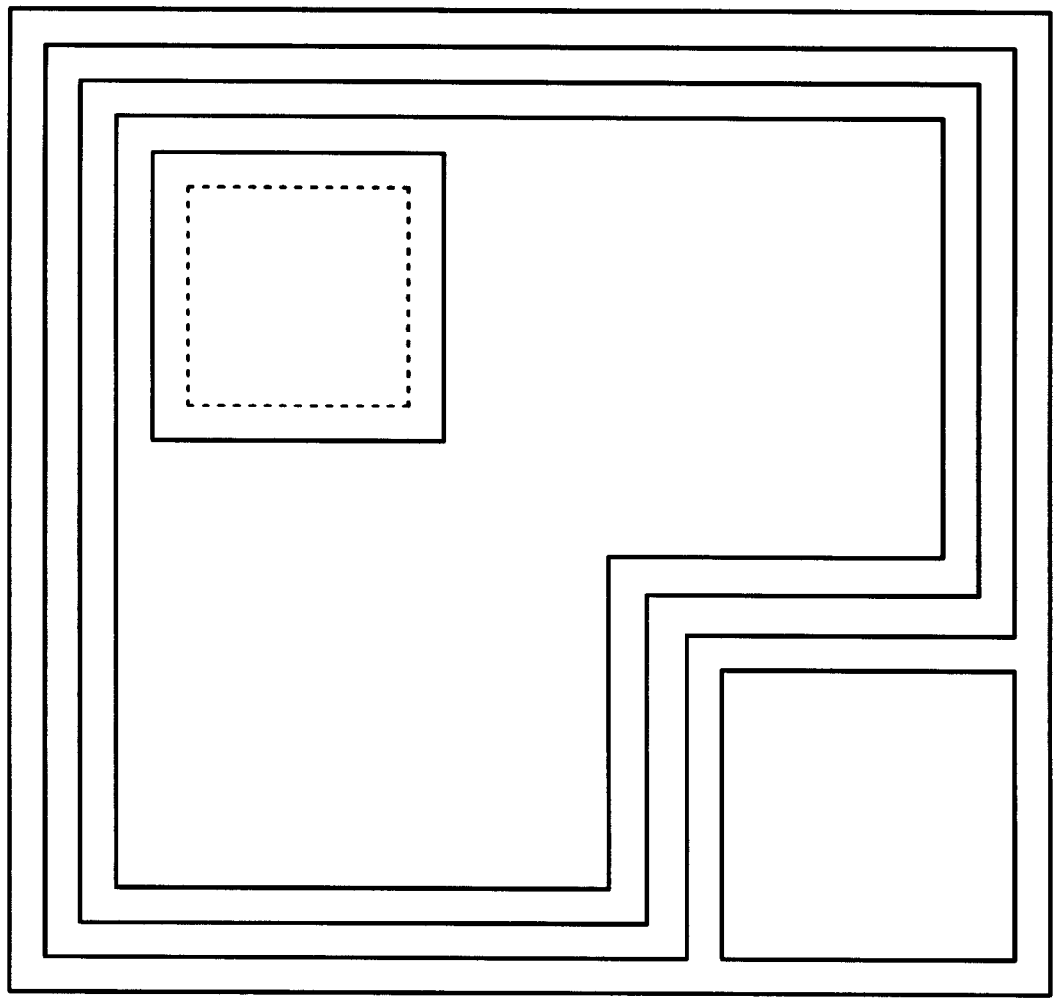
FIG. 1 illustrates a light-emitting diode (LED) of the prior art.

In the present invention, the "area utilization ratio" of a surface (top or back) of an light-emitting device (LED) is defined as the ratio A of the p-n junction, light-emitting region, to the total area of the substrate. For a given average current density, and for a given value of substrate area, the intensity of light emitted increases proportional to the ratio A. Because fabrication costs are largely proportional to the area of the substrate of the LED, it is advantageous to maximize the area utilization ratio A. Commercially available LEDs from non-AlInGaN materials systems (with usually only one connection pad per surface) have typical values of the area utilization ratio A=~1.0. Prior art AlInGaN LEDs, e.g. both connection pads on the same surface have area utilization ratio values where A ranges from 0.25 to 0.50. Manufacturing constraints dictate the size of the connection pads, e.g.~$0.075 \times 10^{-3}$ to $0.2 \times 10^{-3}$ cm$^2$. For a given number of connection pads on a surface, the larger $A_{tot}$, the larger the corresponding A. It would be desirable, for the same range of $A_{tot}$ (i.e., without incurring the higher manufacturing costs that accompany larger $A_{tot}$), to achieve higher ratios A for AlInGaN devices than the ones obtained through prior art.

Improved electrode structures are achieved by altering three parameters, individually or in combination. The factors are the shape of the substrate, the shape of the electrodes, and the position of the electrodes. The substrate may be a sphere, hemisphere, or a solid prism having a cross-sectional area that is selected from a group that includes polygons, e.g. rectangles, parallelograms, hexagons, and triangles, or circles and ellipses. Each electrode may be shaped as a polygon, e.g. rectangle, parallelogram, triangle, or inter-digitated finger or a round shape, e.g. circle or oval or square with rounded corners. Alternatively, at least one of the two electrodes may be segmented to create multiple regions of uniform current density. The average distance between the electrodes is preferably less than the length of the n and p electrodes.

To illustrate the principles at work, a p-type semiconductor material has uniform resistivity p, width W, length L, and thickness t. The sheet resistance R☐ is defined as p/t. Current is injected into the material from the two rectangular electrodes. The electrodes have width w and length l. They are separated by a width s, where $s \leq (L-2l)$. The current flow is uniform. Similar flow uniformity can be achieved with more complex shapes provided the shortest distance s is kept constant for any point along the inner contour of either electrode. It can be shown that the resistance to current flow R between the two electrodes is $$R = R\square \, s/w \tag{1}$$

In Equation 1, the total resistance R depends upon the sheet resistance R☐ and the geometry (s, w) of the electrodes. The total resistance R is minimized when the distance s is minimized while maximizing the width w. The electrons have less distance to traverse horizontally in the n-type semiconductor before recombining with holes injected from the p-contact. The present invention reduces the average distance the carriers traverse and makes this distance the same all along the electrodes. Reducing this distance decreases the series resistance of the device and improves the overall electrical characteristics, while keeping this distance approximately constant makes the local current density uniform. The electrodes should be located as close as possible to one another. It is preferable that these electrodes should cover a large fraction of the edges of the device and that the distance between them should be as uniform as possible to spread the current uniformly, with the associated benefits in electrical, light emission, and reliability behaviors explained later.

The electrodes are the conducting layers electrically connected to the semiconductor material. A simple electrode is an equipotential surface under operation, e.g. its voltage is the same at any point on its surface. Some devices require a compound electrode. The compound electrode may include an additional, very thin e.g. $\leq 0.2$ $\mu$m, semi-transparent, conductive layer (electrically connected typically to a high resistivity p-doped layer and to a thicker electrode or p-connection-pad) to spread the current and extract the light. The thin layer is also an electrode, but is often not an equipotential surface, e.g. has high resistivity and causes significant voltage differences between some points on its surface.

Figure 3:
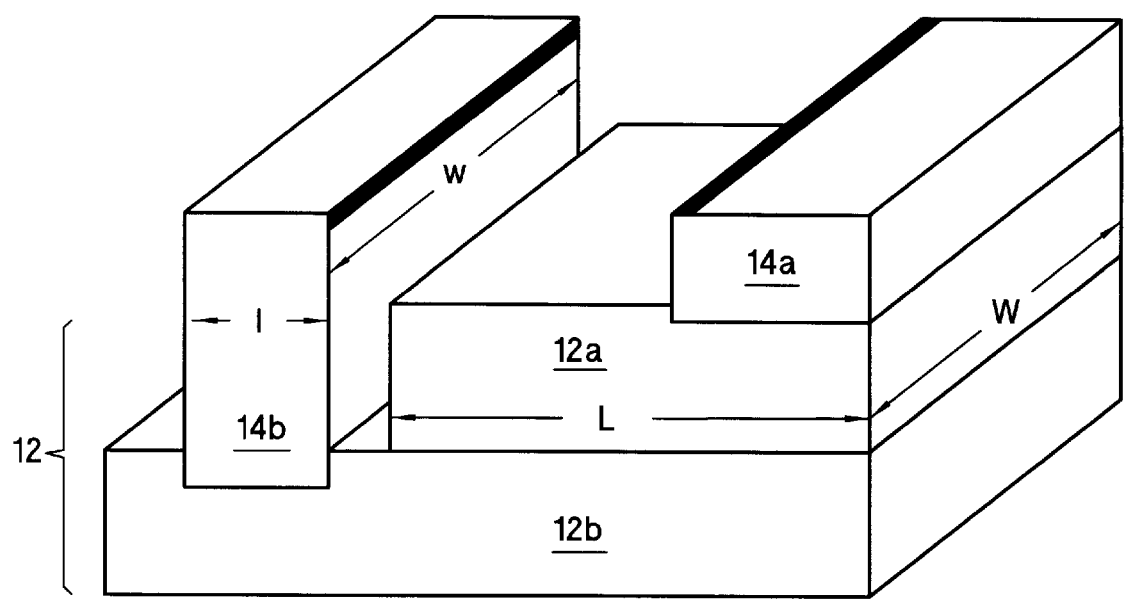
FIG. 3 illustrates an LED of the present invention.

FIG. 3 illustrates an LED of the present invention. The LED 10 includes an active region 12 on an optional substrate (not shown). The active region 12, e.g. a heterojunction, has a p-type and a n-type semiconductor layer 12a, 12b. The p and n-electrodes 14a, 14b are electrically connected to the corresponding semiconductor layer. The p and n-electrodes 14a, 14b are shaped and positioned to provide uniform current density during operation. Bold lines highlight the inner contours of the two electrodes. The device structure includes the optional substrate, the active region and the electrodes. Uniform current density is achieved when the ratio of the maximum local intensity $I_{max}$ to average intensity $I_{ave}$ is less than 3 and preferably less than 1.5–2.

For simple electrodes, it is preferred that shortest distance between the, inner contours of the electrodes at any point be within +35% and +150% of the average distance between the inner contours of the electrodes. For compound electrodes, it is preferred that shortest distance between the inner contours of the connection pads at any point be within ±35% of the average distance between the inner contours of the connection pads, and the shortest distance between the electrodes at any point be within +35% and +150% of the average distance between the electrodes.

Figure 2:
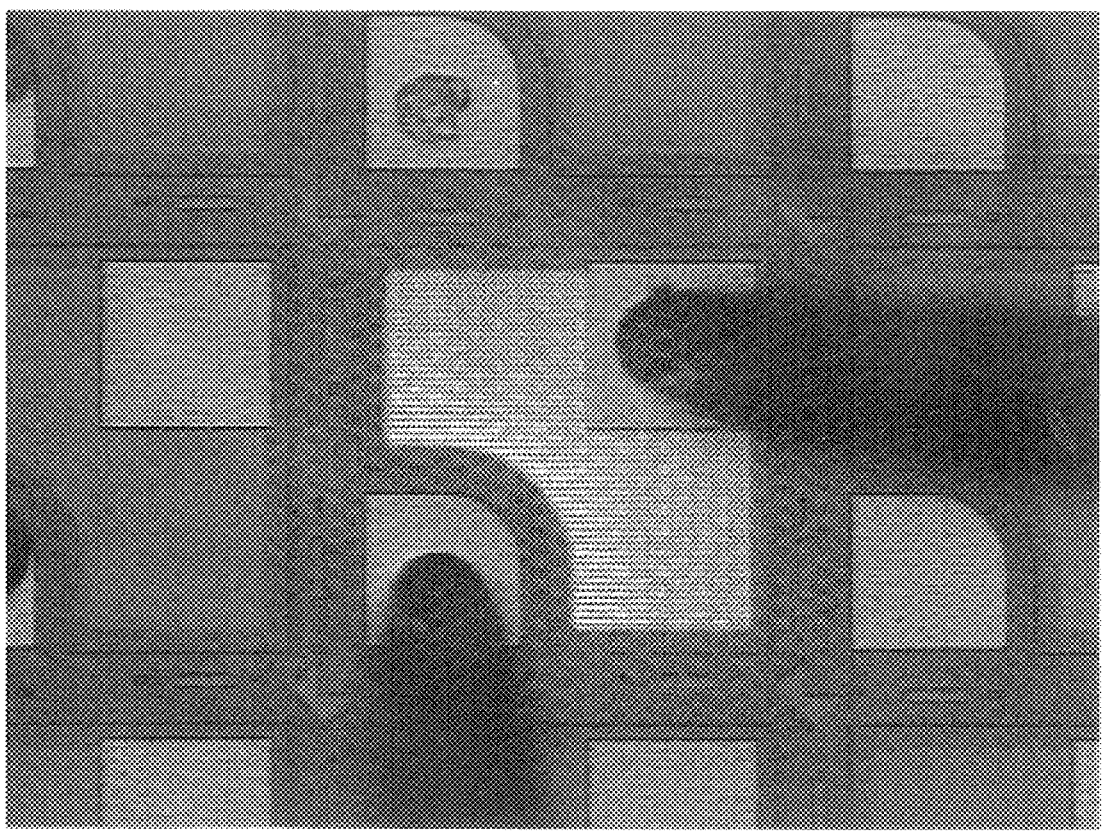
FIG. 2 illustrates a near-field optical photomicrograph of the LED in FIG. 1, forward biased at 50 mA.

These figures of merit were derived as follows. The average human eye readily discerns differences in visible light intensity when the intensity varies over a factor of 3, assuming the intensity does not saturate the optical receptors. A discriminating eye can discern differences over a factor of 2. When the factor is below 1.5, human eyes cannot discern intensity differences. FIG. 2 (prior art) illustrates a case with a light uniformity intensity ratio above 3, while subsequent figures illustrate cases with light uniformity intensity ratio below 3, and in most cases below 1.5.

In the embodiments of the current invention shown in FIGS. 3 to 8E, the minimum length of the electrodes is 75% of the length of the device sides on which they are laid. The maximum deviation in distance between inner contours of the connection pads is ±35%. The maximum deviation from the average distances between the inner contours of p and n electrodes is ±20%. As a result, none of the devices that were fabricated according to a subset of the embodiments shown in FIGS. 3 to 8H has shown light intensity ratios in excess of 2 for an average current density of 50A/cm$^2$.

Figure 4A:
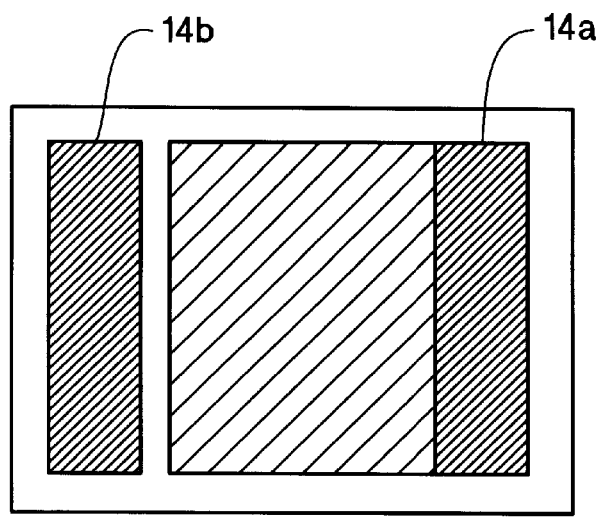
FIGS. 4A–B illustrates alternate embodiments of the present invention.
Figure 4B:
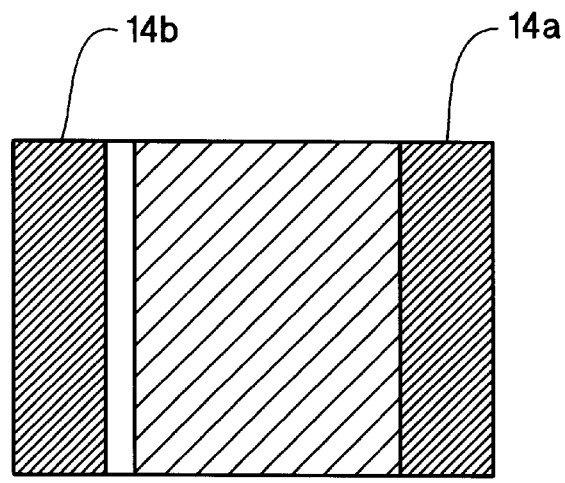

FIGS. 4A–B show embodiments of the present invention. The device is a solid prism with a cross-sectional area that is a polygon. The p and n-electrodes have a length that is at least 65% of the length of at least two sides of the polygon. In the case of an oval shaped device, at least one of the two electrodes has a length that is $\geq 25$% of the length of the peripheral length of the device. The electrodes can be either simple or compound. The inner perimeters of the electrodes are preferably parallel to one another. It is preferable that the polygon be a square, hexagon, octagon, rectangle, or parallelogram.

The 65% figure of merit was chosen to ensure that at least ⅓ of the total device cross-sectional area will have a uniform current flow, thus guaranteeing, worst case, a light intensity ratio $\leq 3$. The ±35% figure of merit for deviations from the average distance between the connection pads of compound electrodes was chosen for similar reasons.

Figure 5A:
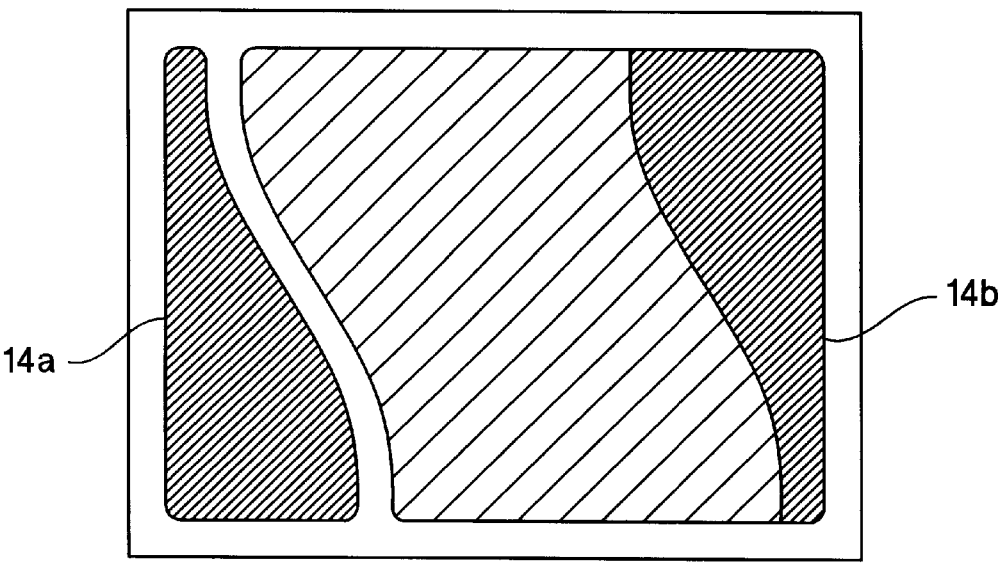
FIGS. 5A–B illustrates embodiments of the present invention with connection pad areas optimized for wire-bonding.
Figure 5B:
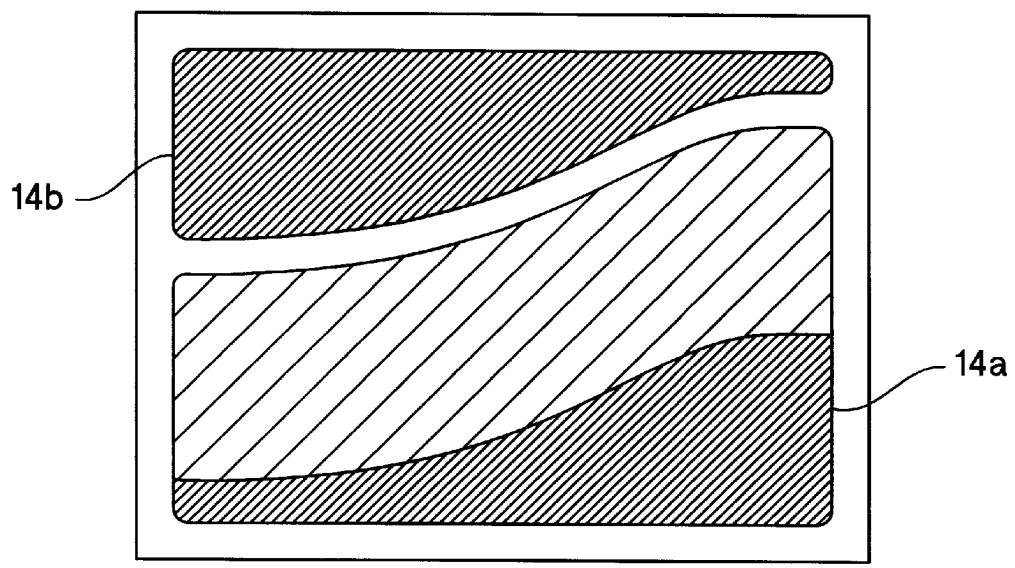

FIGS. 5A–B show alternate embodiments having a compound electrode. The connection pad of the compound electrode is suitable for wire bonding, e.g. ball bonding or wedge bonding, or for soldering, or for attaching with a conducting medium. The electrodes are tapered away from the connection pad area to increase the size of the light emission area between the connection pads. In the embodiment shown in FIG. 5B, the length of the inner perimeters of the electrodes is longer than the average distance between the electrodes. This configuration decreases the electrical resistance of the device.

Figure 6A:
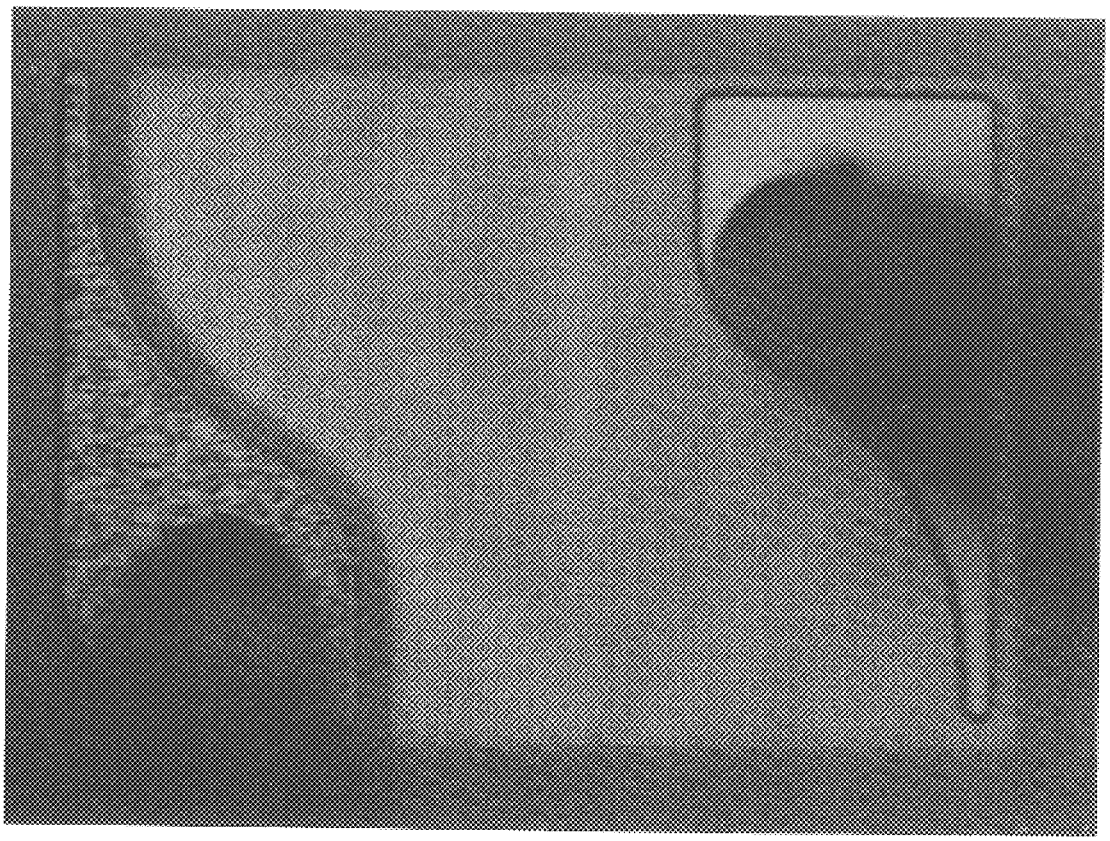
FIGS. 6A–B illustrate a near-field optical photomicrographs of the LEDs in FIGS. 5A–B, forward biased at 50mA.
Figure 6B:
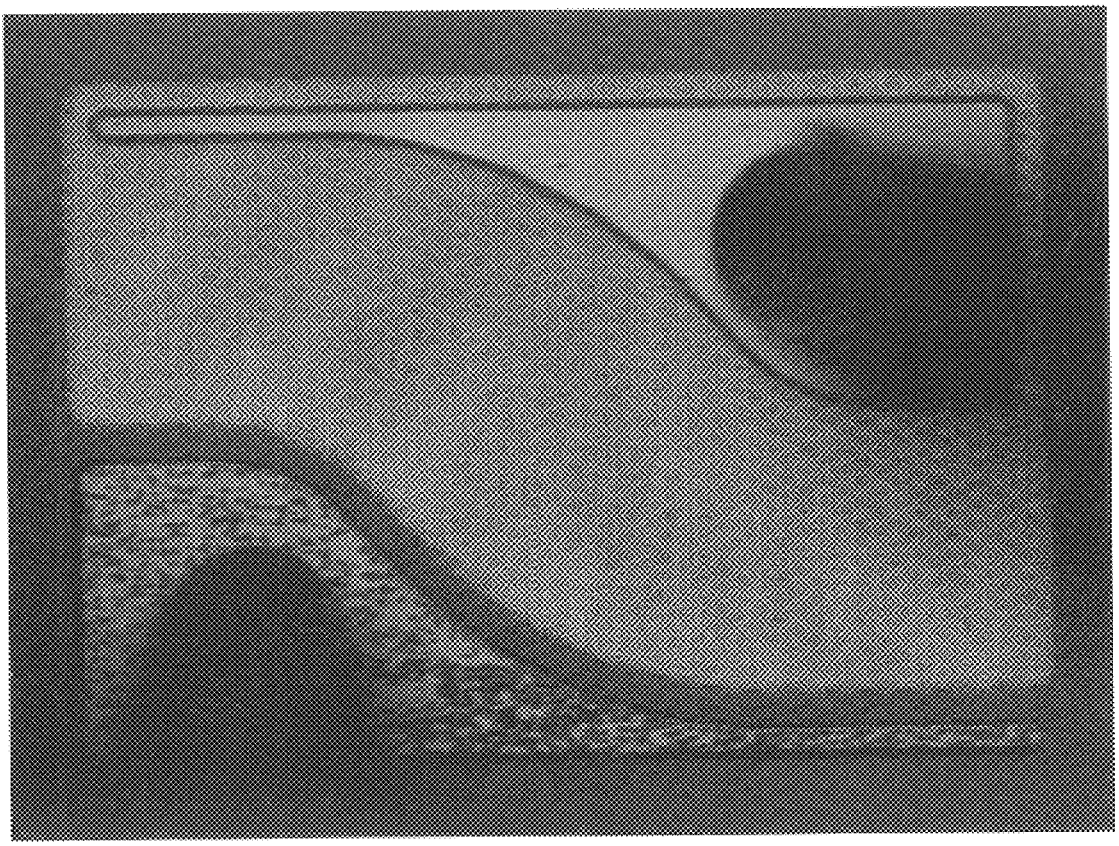
Figure 7:
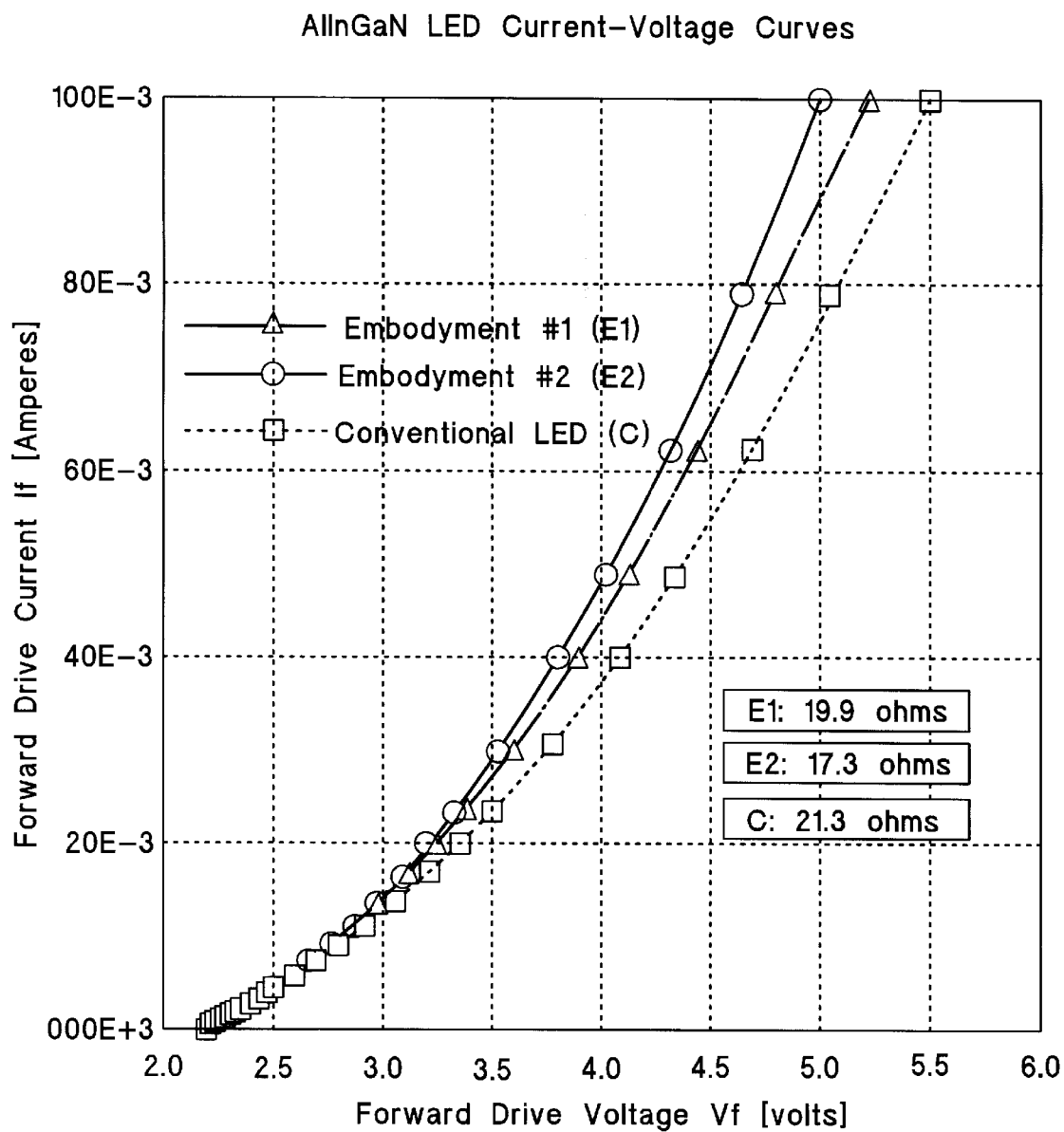
FIG. 7 compares the I-V curves for LEDs shown in FIGS. 1 and 5A–B.

FIGS. 6A–B illustrate near-field optical photomicrographs of LEDs shown in FIGS. 5A–B, when forward biased at a current of 50 mA. There is uniform intensity across the light-emitting region of the device. Unlike FIG. 2, no current crowding can be seen near the gap between the two electrodes, and no differences in light intensity can be seen in the area covered by the thin electrode. FIG. 7 compares the I-V curves for LEDs shown in FIGS. 1 and 5A–B. FIG. 1 corresponds to "conventional LED." FIG. 5A corresponds to "Embodiment #1" while FIG. 5B corresponds to "Embodiment #2." Two AlInGaN wafers were split into halves. One set of halves was fabricated with device according to FIG. 1, while the other set was fabricated according to the devices shown in FIGS. 5A–B. Each of the devices has the same total cross-sectional area, e.g. 1.2×10$^{-3}$ cm$^2$. Typical I-V curves are shown for devices selected as close to one another as possible on either side of the wafer's split. The y-axis displays the drive current If, while the x-axis displays the drive voltage $V_f$. The slope of the curves at high currents is approximately inversely proportional to the series resistance of the device. FIG. 7 illustrates the reduction in the series resistance of AlInGaN LEDs according FIGS. 5A–B. These devices have ~10% ($R_S$=19.9$\Omega$ for "Embodiment #1") to 20% ($R_S$=17.3 f) for "Embodiment #2$\Omega$) lower series resistance than the conventional chip ($R_S$=21.3$\Omega$), all other growth and fabrication parameters being equal. This improvement in series resistance is a gain of 0.2–0.3 V in operating voltage for a drive current of 50 mA, yielding average voltages at that current for devices according to FIGS. 5A–B comparable to the average voltage of a prior art device of FIG. 1 driven at 20 mA. The better electrical performance of "Embodiment #2" is expected since the separation between electrodes is much smaller than their length. At higher drive currents, the improvement in drive voltage due to the smaller $R_S$ is even more dramatic. At lower drive currents, the influence of Rs is reduced, but improvements in $V_f$ are still seen due to the improvements in local current density uniformity. A forward voltage of 3.25 V was measured at a drive current of 20 mA for devices of FIGS. 5A–B, while 3.4 V was measured for device of FIG. 1.

In another set of similar experiments performed with AlInGaN material grown at a later date, a similar set of data and conclusions were obtained. Averages of 3.05, 2.85, and 3.35 V were obtained at a forward drive current of 20 mA for devices shown in FIGS. 5A, 5B, and 1, respectively. Averages of 3.65, 3.35, and 4.15 V, were obtained at a forward drive current of 50 mA for devices shown in FIGS. 5A, 5B, and 1, respectively.

The "area utilization ratio" is calculated to be 60% for the device in FIG. 5A ($A_{tot}=1.2\times10^{-3}$ cm$^2$), an improvement over devices manufactured with geometry as shown in FIG. 1 which typically displays a ratio A of between 25–50% for a similar value of $A_{tot}$. The devices shown in FIGS. 5A–B are manufactured with standard semiconductor fabrication techniques consistent with high-volume manufacturing. The area utilization ratio A can be improved by defining tapered arms with a smaller width, by shrinking the area of the connection pads, and by using tighter tolerances. Although the embodiments shown in FIGS. 5A–B are displayed as a wire-bonded device, the devices may be manufactured in a flip-chip configuration.

Figure 8A:
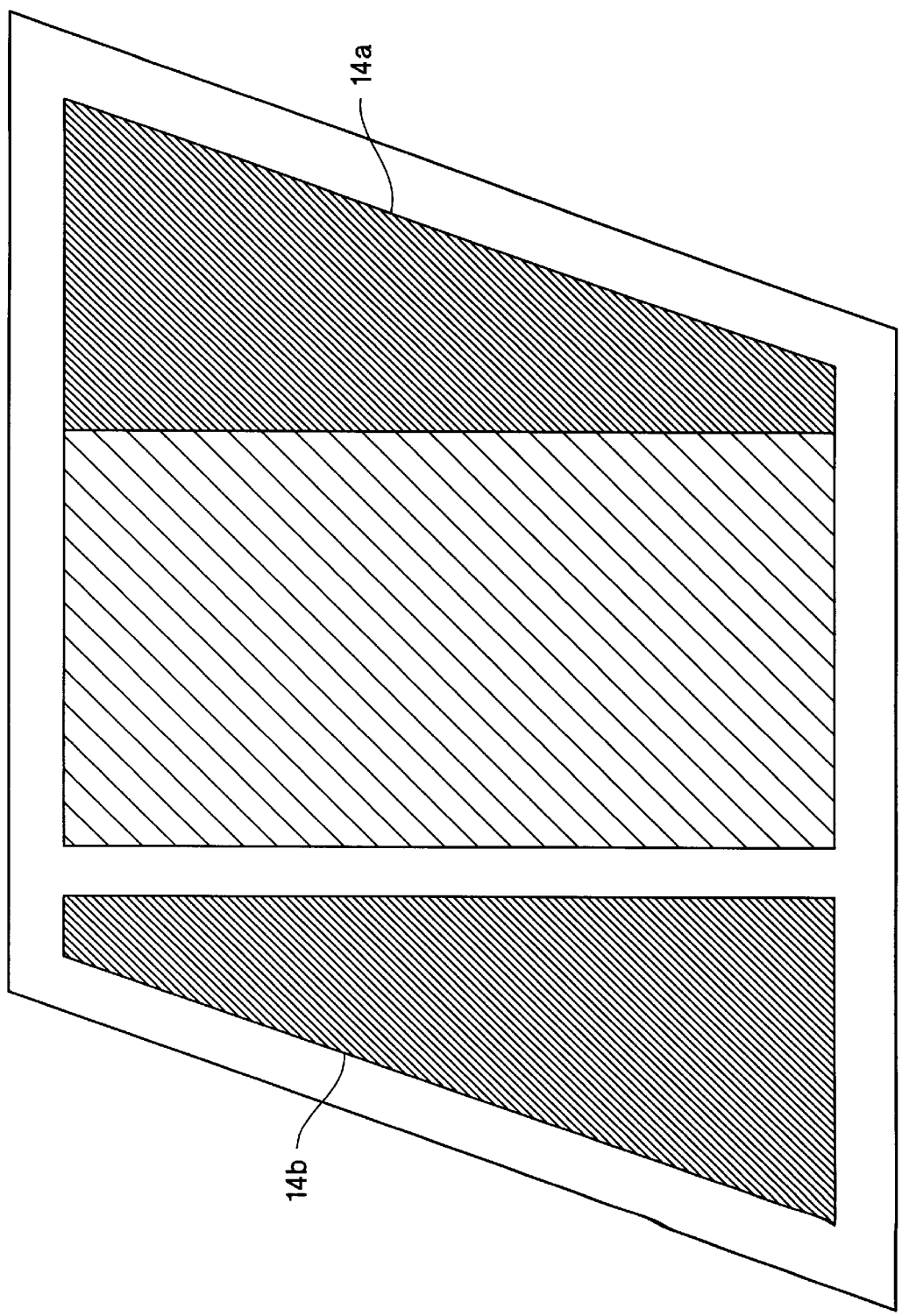
FIGS. 8A–H illustrate alternate embodiments of the present invention.
Figure 8B:
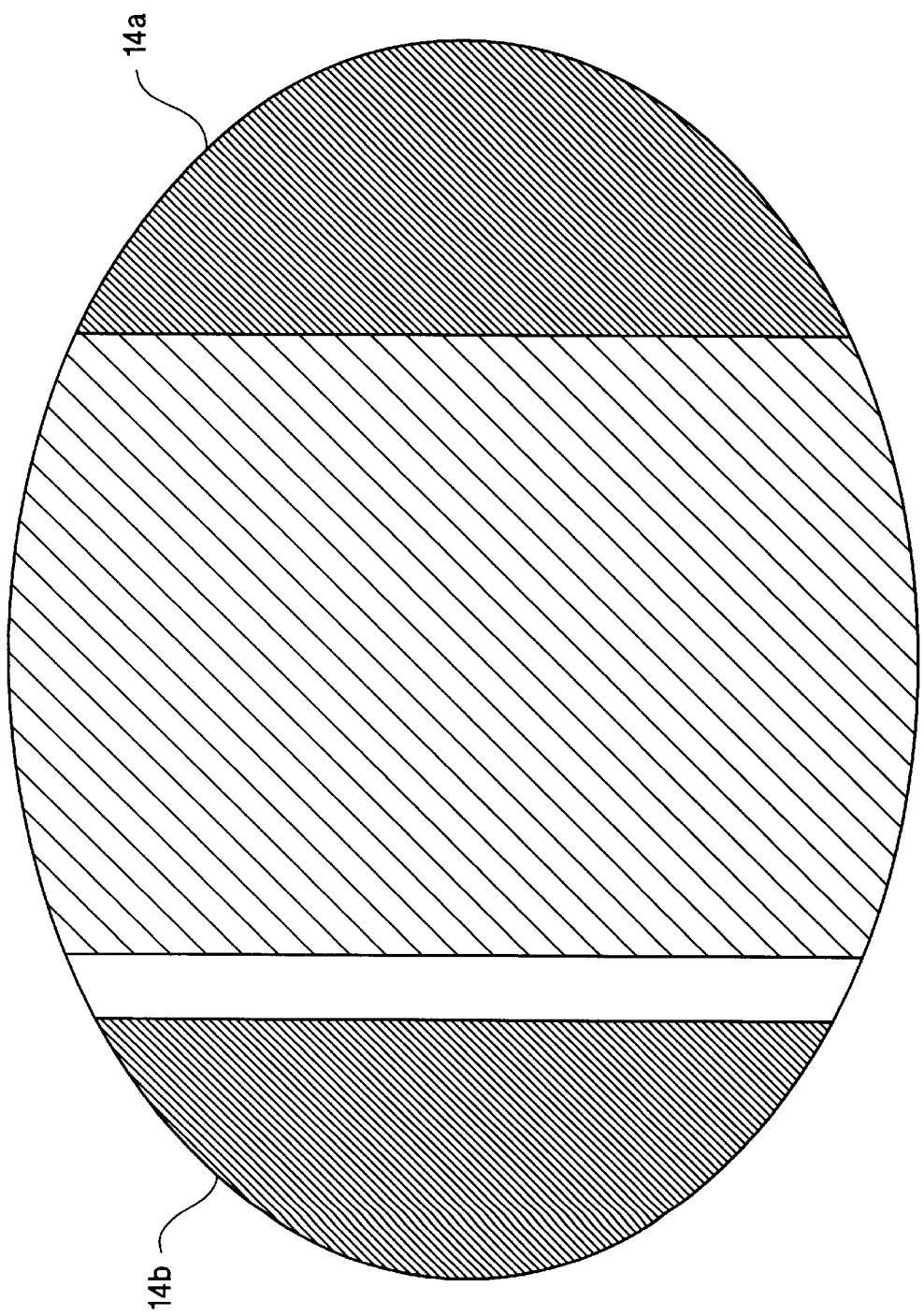
Figure 8C:
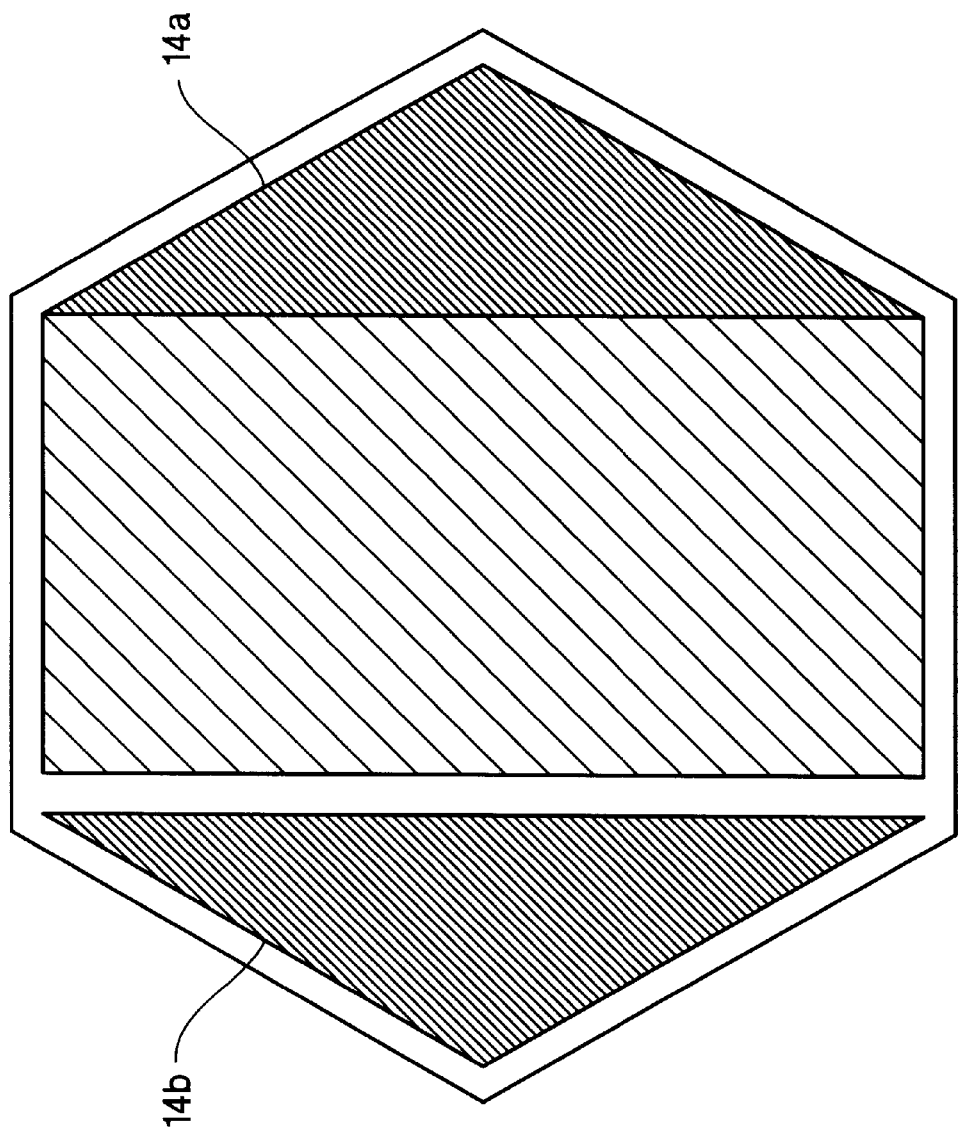
Figure 8D:
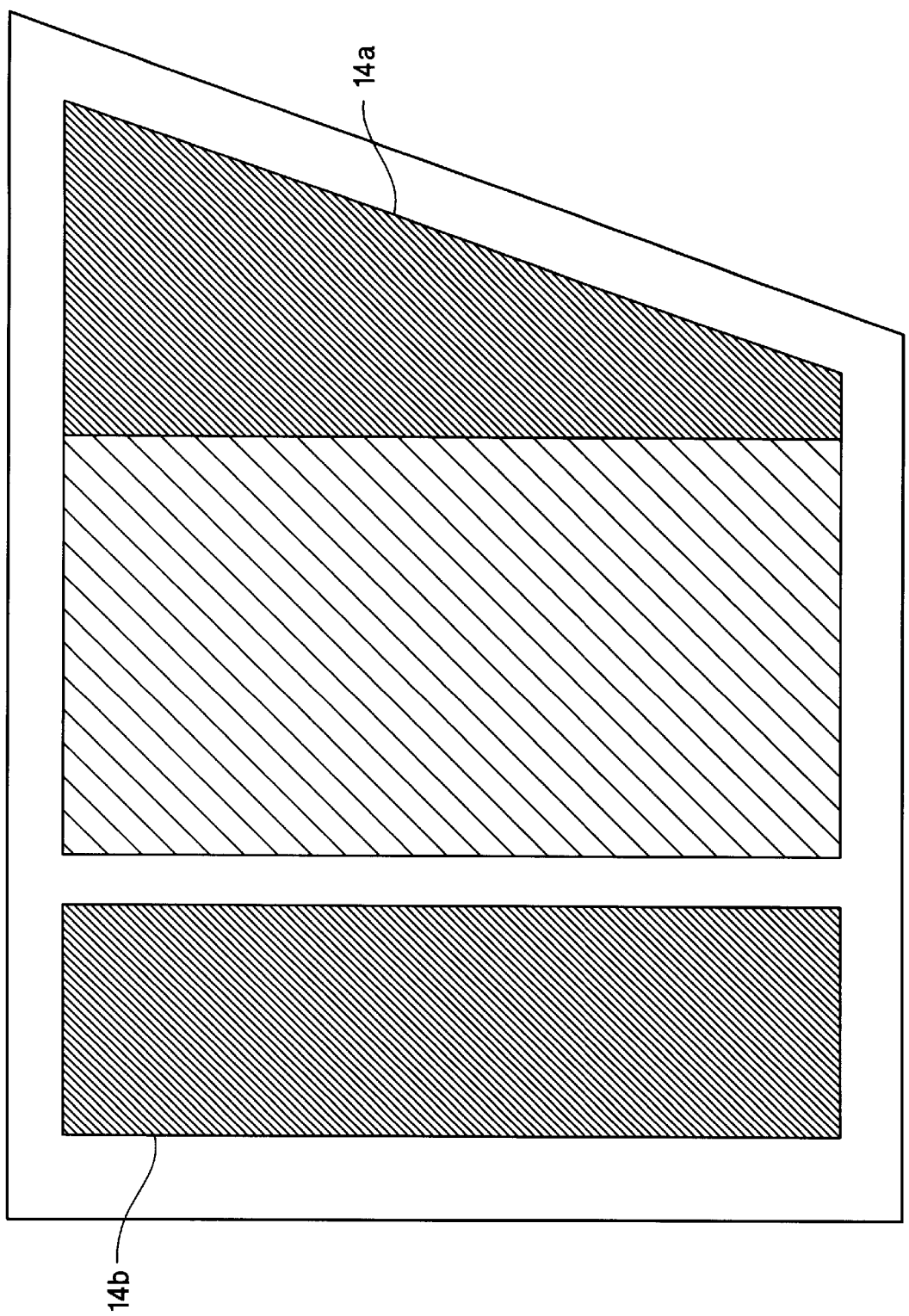
Figure 8E:
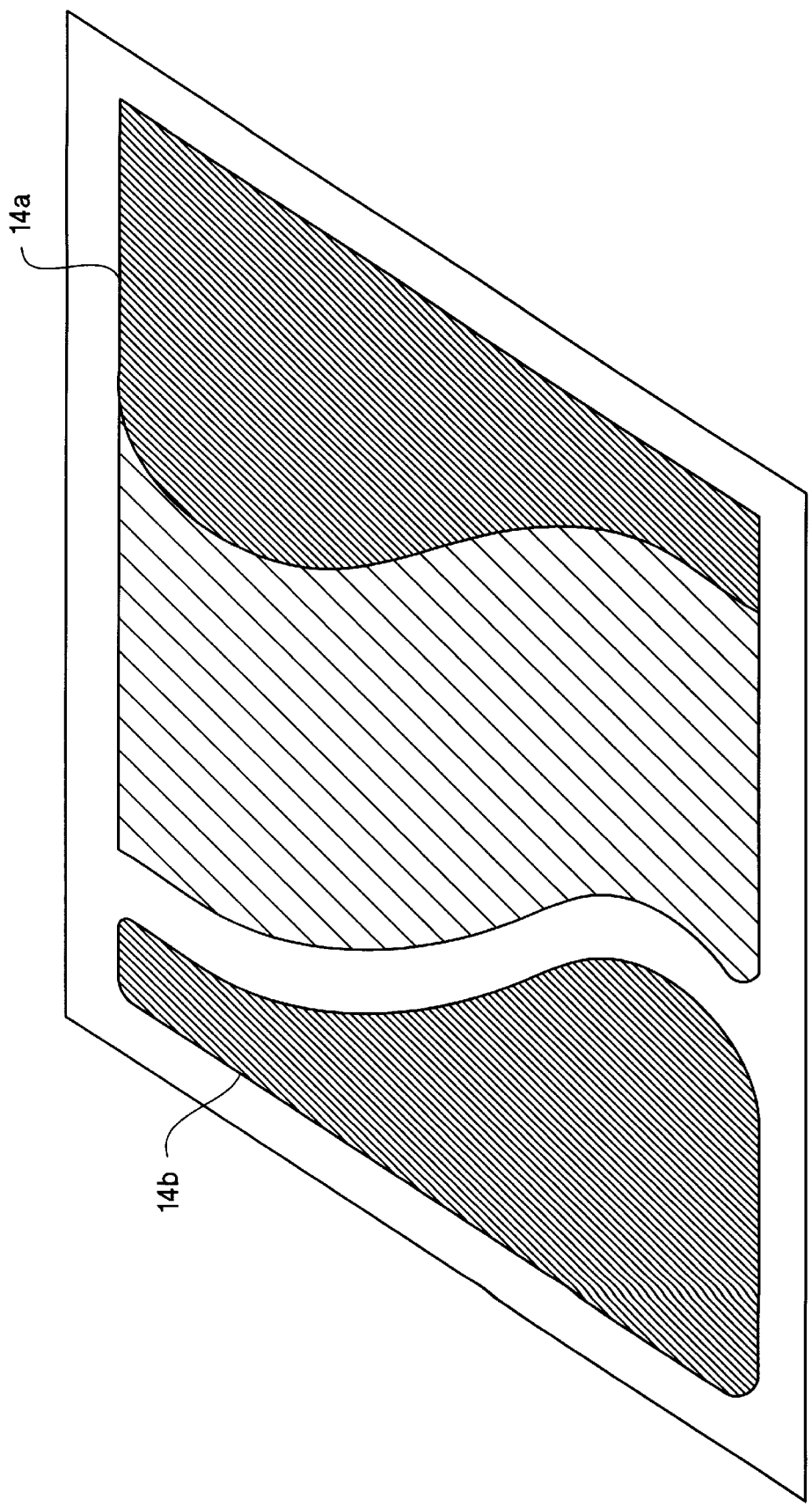

FIGS. 8A–H illustrates alternate embodiments of the invention. The electrodes may be simple or compound. For each embodiment, the cross-sectional area of the device controls the current density. In FIG. 8A, the cross-sectional area is a parallelogram. In FIG. 8B, the cross-sectional area is rounded, e.g. elliptical, circular or spherical. In FIG. 8C, the cross-sectional area is hexagonal. In FIG. 8D, the cross-sectional area is an irregular polygon. In FIG. 8E, the cross-sectional area is a parallelogram with tapered connection pads. For FIGS. 8A–E, the inner contours of the electrodes are parallel to one another, but not necessarily parallel to the sides of the cross-sectional area of the device.

Figure 8F:
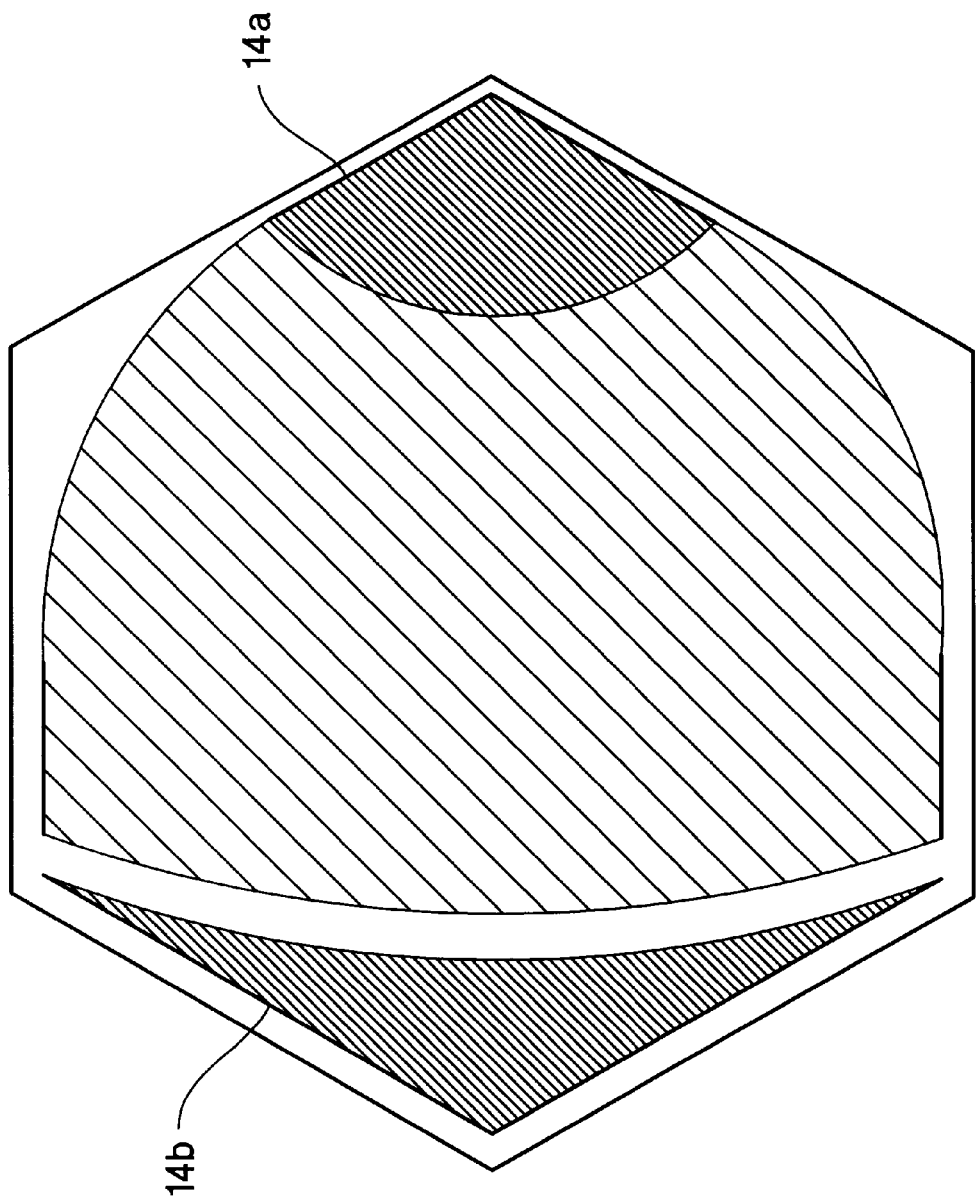
Figure 8G:
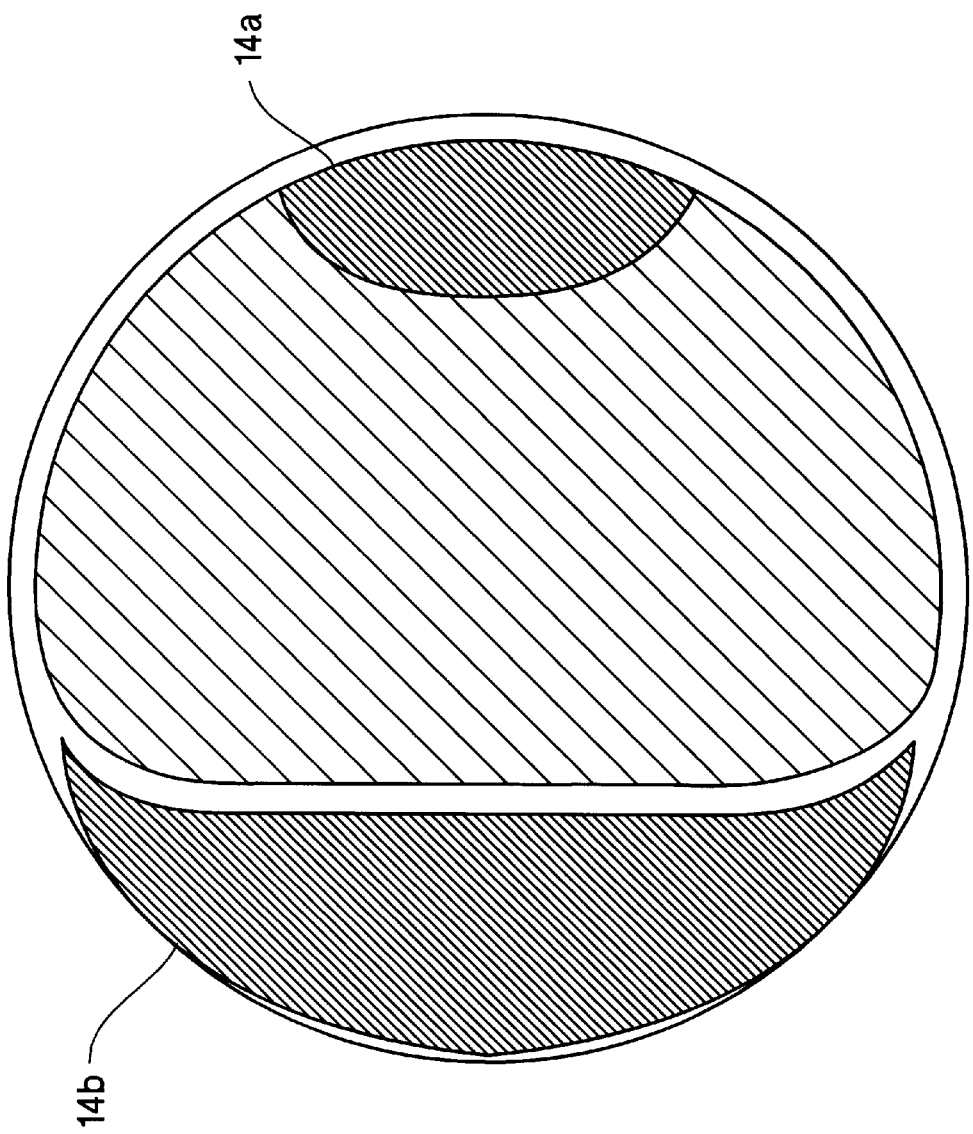
Figure 8H:
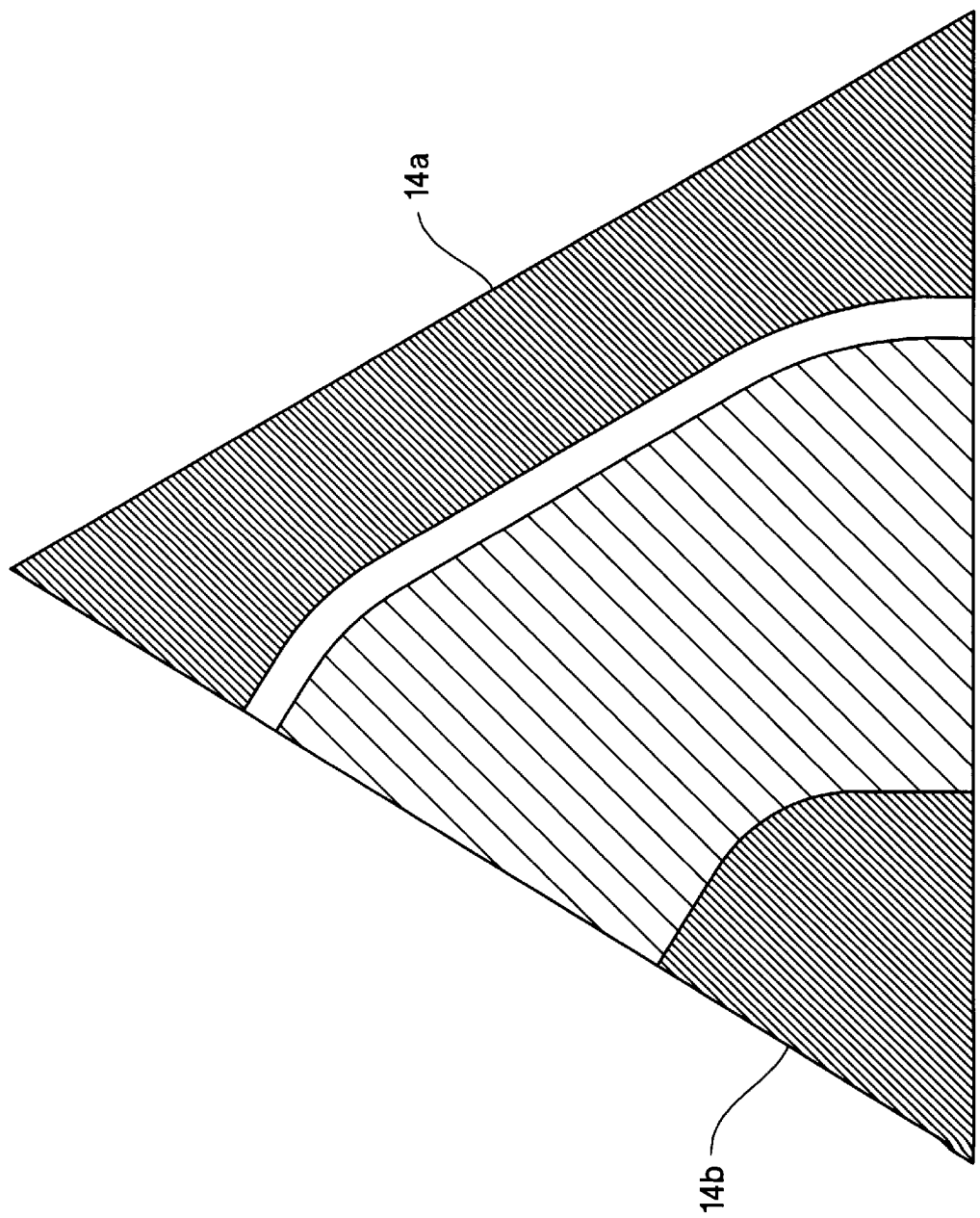

In FIG. 8F, the cross-sectional area is hexagonal and has at least one compound electrode. The connection pad of the compound electrode is located near the corner of the hexagon. FIG. 8G illustrates an alternate embodiment for the device shown in FIG. 8F. The cross-sectional area is a polygon having seven or more sides, or optionally elliptical or circular. FIG. 8H illustrates an alternate embodiment for the device shown in FIG. 8F. The cross-sectional area is a polygon having five or fewer sides. In FIGS. 8F–H, the inner electrodes are nearly parallel to one another, but are not parallel to the sides of the cross-sectional area.

FIGS. 3 to 8 illustrate embodiments that produce current density uniformity ratios and associated light intensity uniformity ratios $\leq 2$, as well as area utilization ratios $\geq 50\%$, for total cross-sectional areas smaller than $2\times10^{-3}$ cm$^2$. When the cross-sectional area is $\geq 1\times10^{-3}$ cm$^2$, embodiments presented below yield even lower uniformity ratios and even higher area utilization ratios.

Figure 9:
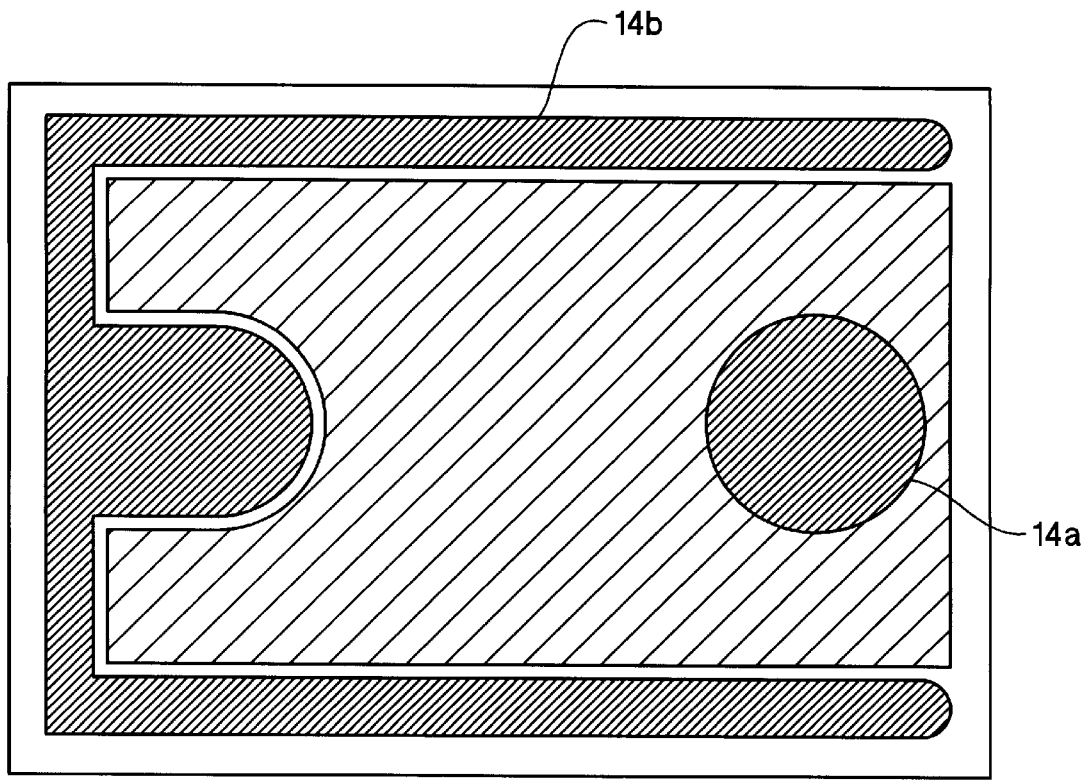
FIG. 9 illustrates an embodiment of the invention having an outer electrode.

FIG. 9 illustrates an embodiment having a substrate with rectangular cross section and dimensions of $0.3\times0.4$ mm$^2$, including a compound electrode connected to the n-type semiconductor layer, that encompasses three sides of the peripheral of the substrate, with an attached connection pad. This n-electrode is an outer or enclosing electrode that has two outer and N inner arms, where $N\geq 0$, and a crossbeam connecting the two outer and N inner arms. The projection of the outer arms encloses at least 75%, preferably 100% of the light emitting region. A second compound electrode is connected to the p-type semiconductor layers. It consists of a semi-transparent metallic layer to spread the current over a majority of the light-emitting region, and a connection pad. The connection pads in this embodiment may be wire bonded with a diameter of approximately 0.1 mm. The light emitting region is fully enclosed within the projection of the outer arms.

Figure 10:
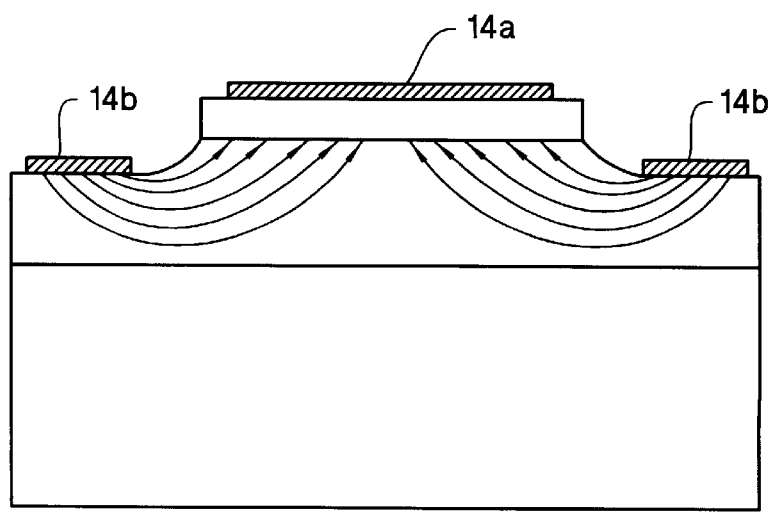
FIG. 10 is a schematic illustration of the current flow in the LED in FIG. 9.
Figure 11:
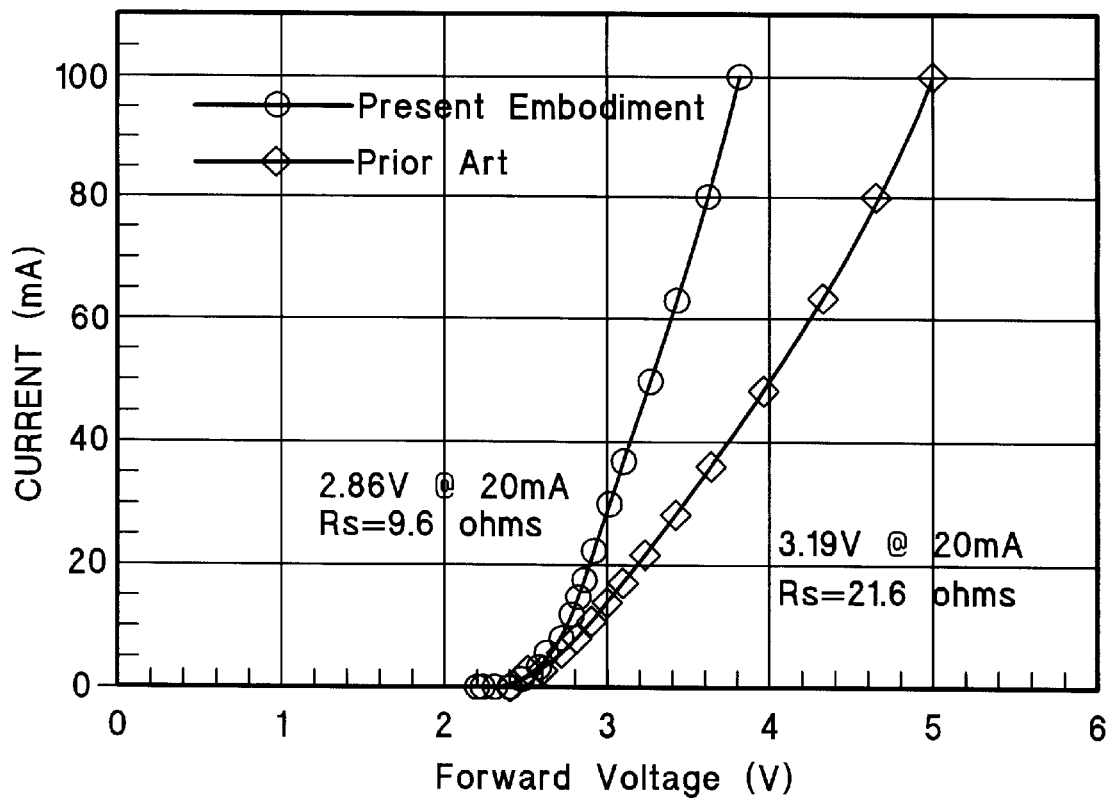
FIG. 11 compares the I-V curves for LEDs shown in FIGS. 1 and 9.
Figure 12A:
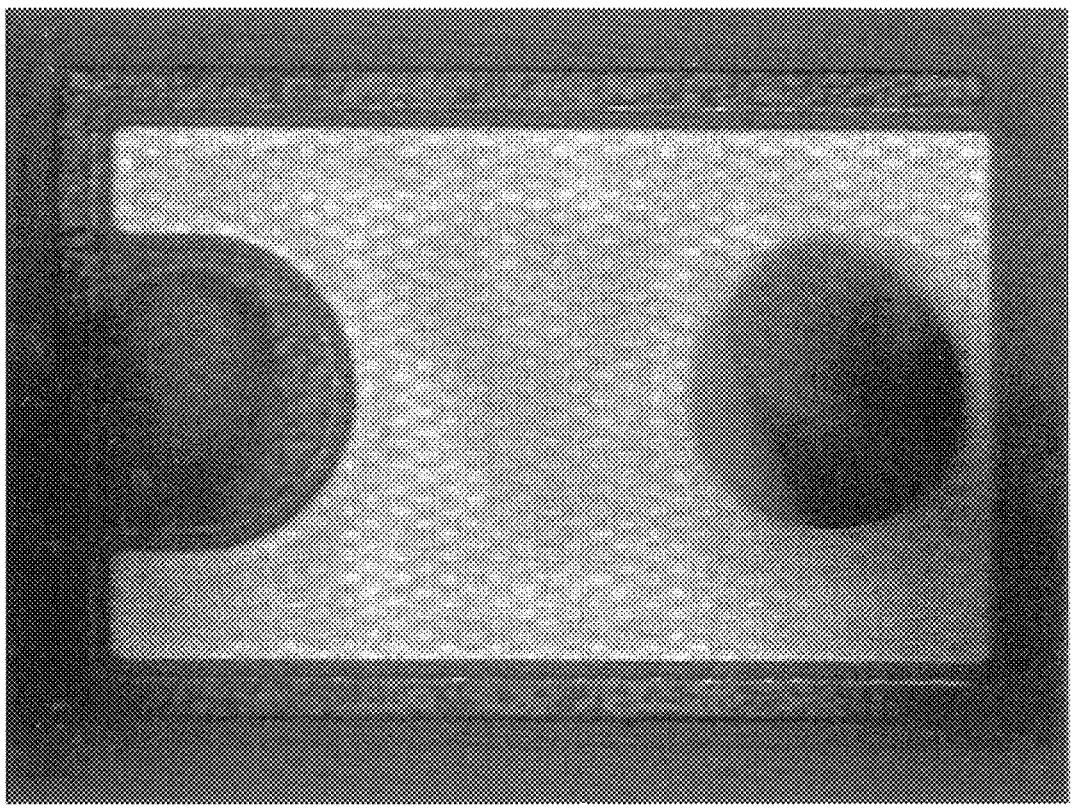
FIGS. 12A–B illustrate near-field optical photomicrograph of the LED in FIG. 9, forward biased at 50 mA and 200 mA, respectively.
Figure 12B:
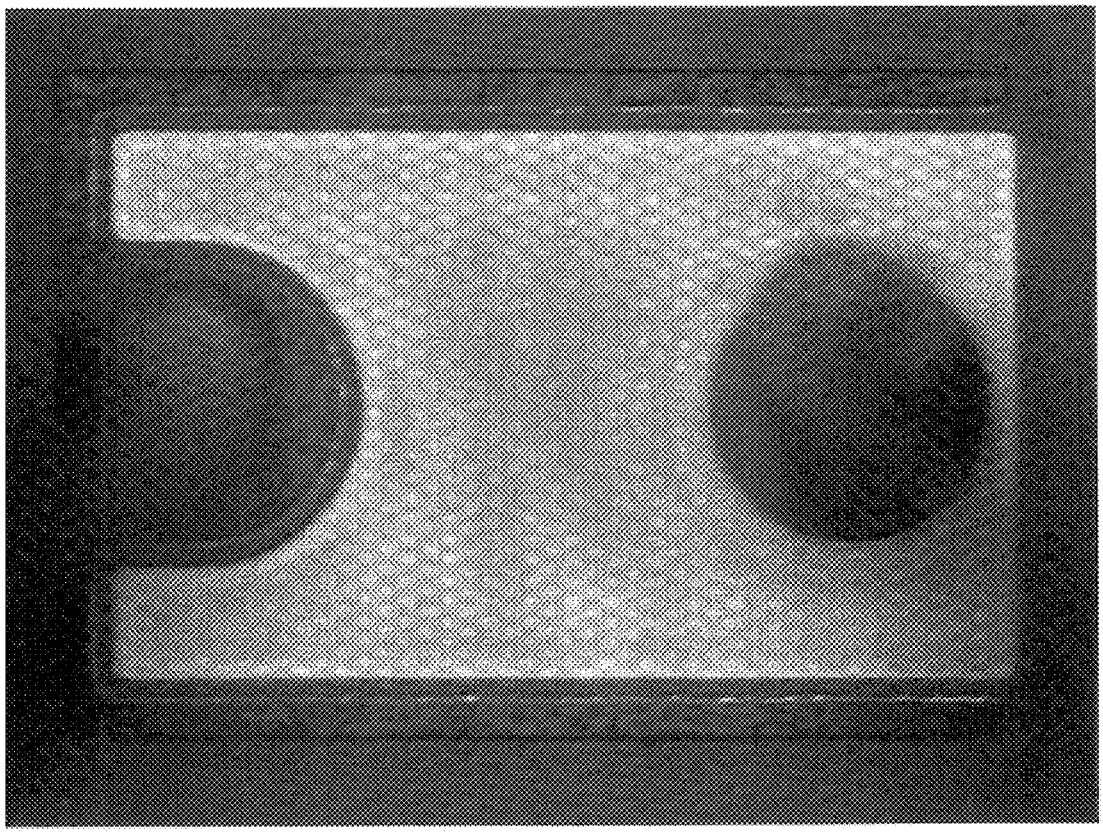

The enclosing, outer electrode improves the uniformity of current density and decreases the series resistance of the device. FIG. 10 illustrates a cross-sectional view of the LED in FIG. 9. The arms of the outer electrode provide two separate paths for the current flow to improve the current uniformity by effectively reducing the average current density. In addition, the average distance that the current must travel laterally in the n-type semiconductor layer leads to a reduction in the series resistance of the light-emitting device. FIG. 11 compares the I-V curves the device shown in FIG. 9 with the prior art device shown in FIG. 1. The device of FIG. 9 displays a reduced operating voltage, defined as the voltage required to inject 20 mA through the device in a forward direction, and a substantially reduced series resistance as evidenced by the slope of the I-V relationship. Values of the forward voltage and series resistance are 2.86 V and 9.6Ω for the device of FIG. 9, and 3.19 V and 21.6Ω for devices of fabricated according to FIG. 1. The improvement in uniformity of current density is evidenced in FIGS. 12A–B, that display near-field optical photomicrographs of LEDs of FIG. 9 when forward biased to 50 mA, and 200 mA, respectively. These figures show no discernible non-uniformity in the emission intensity, in contrast to the similar photomicrograph shown in FIG. 2 of the device of FIG. 1.

The area utilization ratio is calculated to be 55% for the device of FIG. 9, a substantial improvement over the device of FIG. 1. The device shown in FIG. 9 is manufactured with standard semiconductor fabrication techniques consistent with high-volume manufacturing. The area utilization ratio could be substantially improved by defining arms with a smaller width, and by using tighter tolerances. Although the embodiment of FIG. 9 is displayed as a wire-bonded device, the LED may be manufactured in a flip-chip configuration. For the purposes of this invention, arms are considered to be single or multiple connected electrodes of arbitrary shape.

Figure 13:
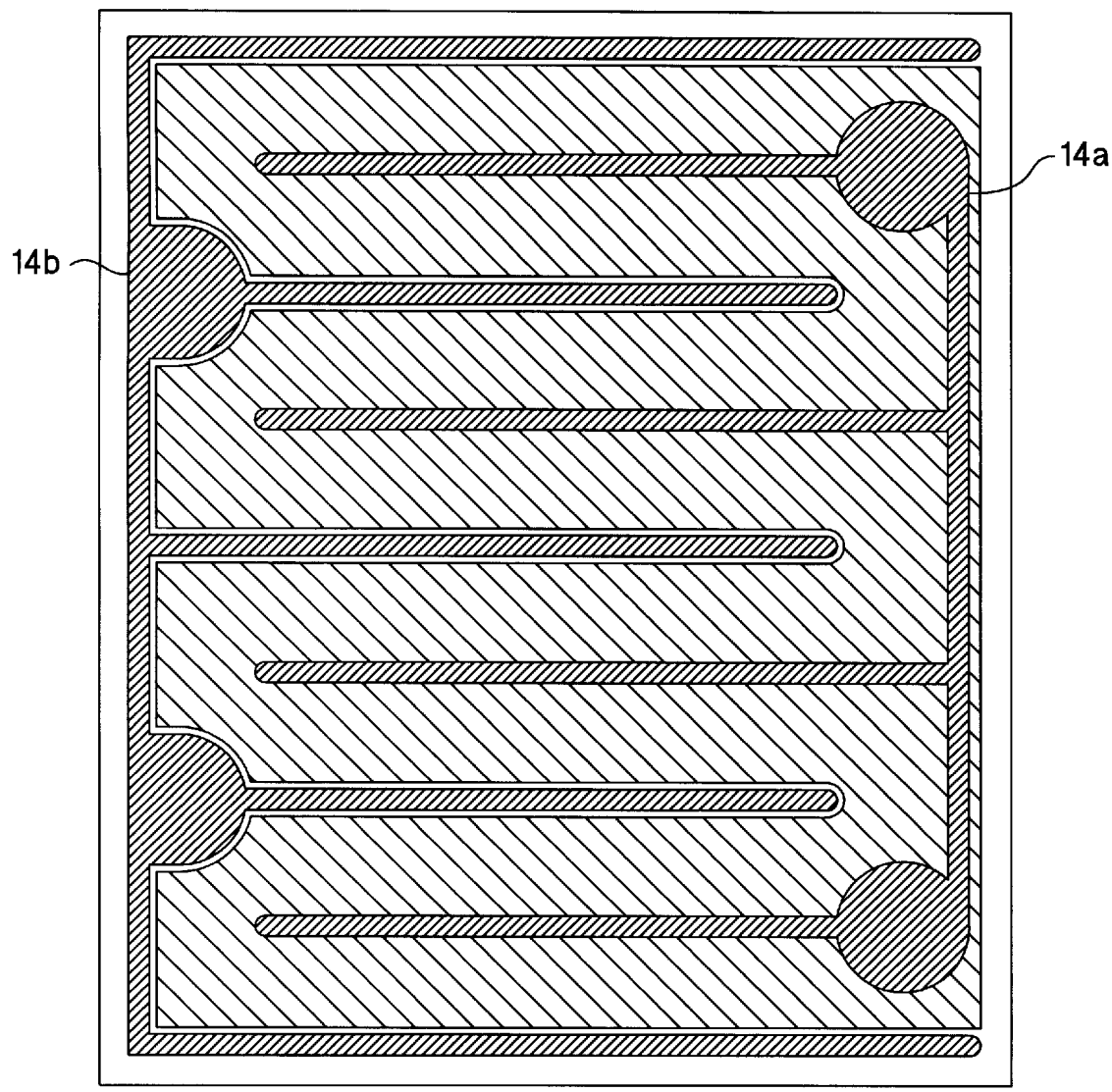
FIG. 13 illustrates an alternate embodiment having inter-digitated outer and inner electrodes.

FIG. 13 illustrates an alternate embodiment of the present invention having a substrate with a square cross section and dimensions of $1.0\times1.0$ mm$^2$, includes a compound electrode connected to the n-type semiconductor layer, that encompasses three sides of the peripheral of the substrate, with two connection pads. A second compound electrode is connected to the p-type semiconductor layers. It consists of a semi-transparent metallic layer to spread the current over a majority of the light-emitting region and two connection pads. The connection pads are intended for wire bonding with a diameter of approximately 0.1 mm. Multiple connection pads are attached to both electrodes for the purposes of redundancy and for operation at high operating current. The light emitting region is fully enclosed within the projection of the arms of the outer electrode. The enclosing, outer electrode serves to improve the uniformity of current density and decreases the series resistance of the LED.

Figure 14:
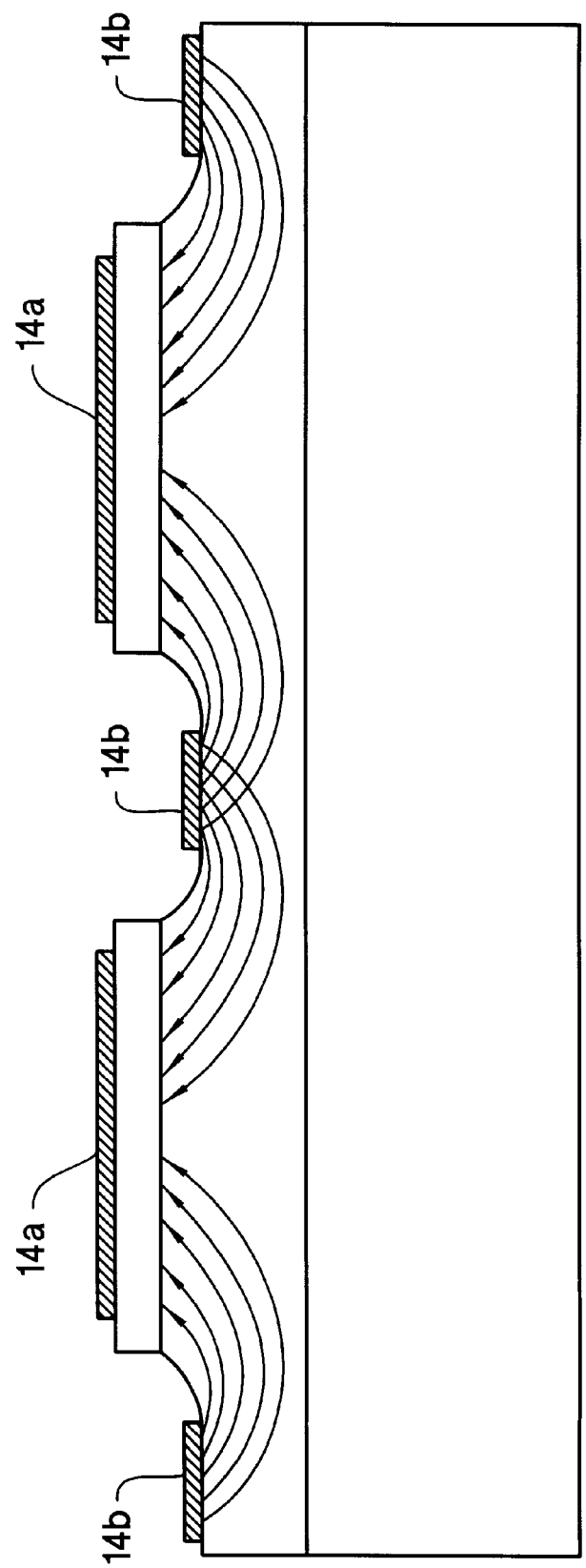
FIG. 14 illustrates a schematic of the current flow in the invention in FIG. 13.

FIG. 14 illustrates a partial cross-sectional view of the LED in FIG. 13. The arms of the outer electrode provide two separate paths for the current flow to improve the current uniformity by effectively reducing the average current density. The smaller average distance that the current must travel laterally in the n-type semiconductor layer leads to a reduction in the series resistance of the LED. The multiple parallel arms leads to additional paths that further reduce the series resistance of the LED.

Figure 15:
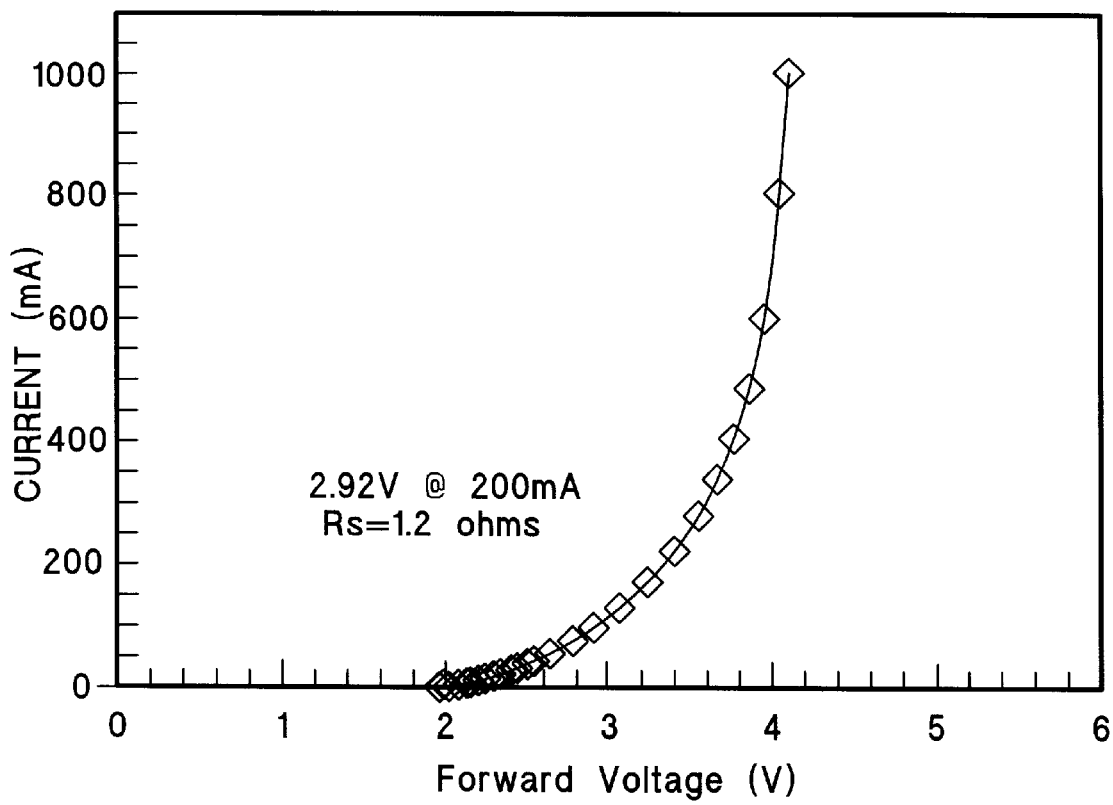
FIG. 15 illustrates the I-V curve for LEDs shown in FIG. 13.
Figure 16:
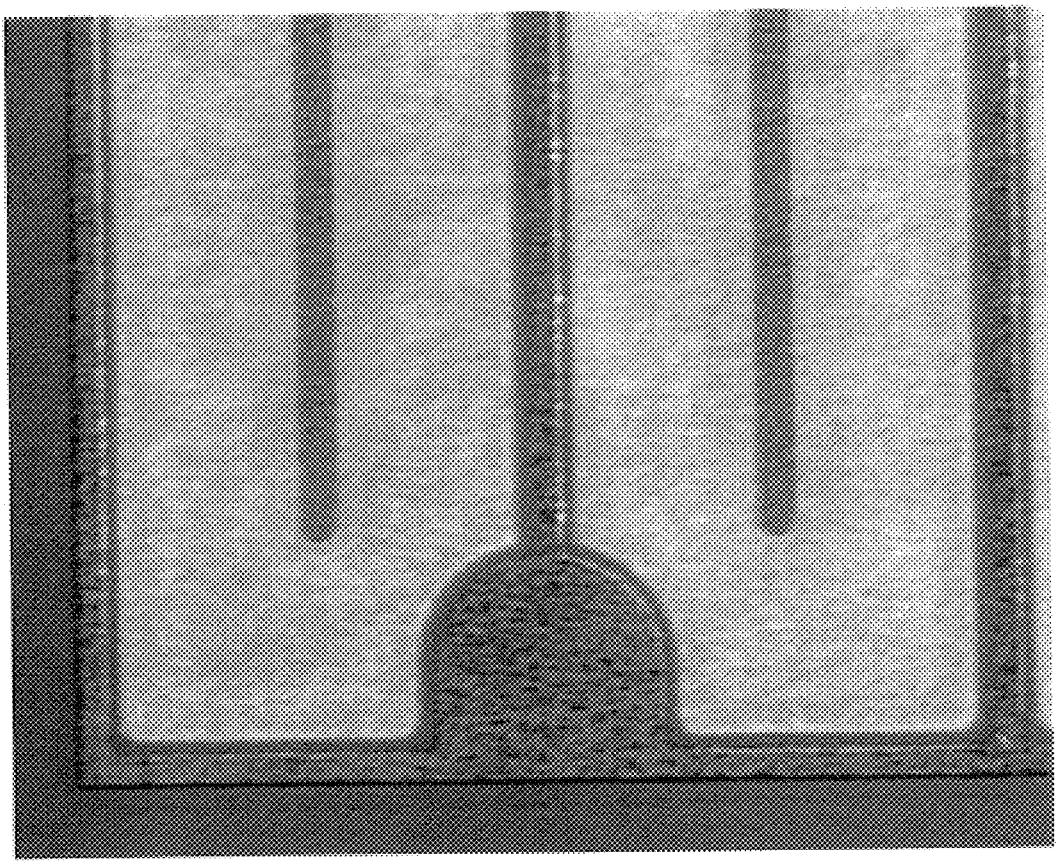
FIG. 16 illustrates a near-field optical photomicrograph of a portion of the LED in FIG. 13, forward biased at 500 mA.

FIG. 15 illustrates the I-V relationship for the device shown in FIG. 13, that displays an operating voltage of 2.92 V at a forward current of 240 mA, and a series resistance of 1.2Ω. The uniformity of current density is evidenced in FIG. 16, a near-field optical photomicrograph of a section of the light-emitting region, operating at a forward current of 500 mA. No discernible non-uniformity in intensity is evident in the emission at this current corresponding to a current density of ~70 A/cm².

The area utilization ratio for this 1×1 mm² LED shown in FIG. 13 is calculated to be 74%. The device is manufactured with standard semiconductor fabrication techniques consistent with high-volume manufacturing. The area utilization ratio could be substantially improved by defining arms with a smaller width, and by using tighter tolerances. Although the embodiment described in FIG. 13 is displayed as a wire-bonded device, the LED may be manufactured in a flip chip configuration.

Figure 17A:
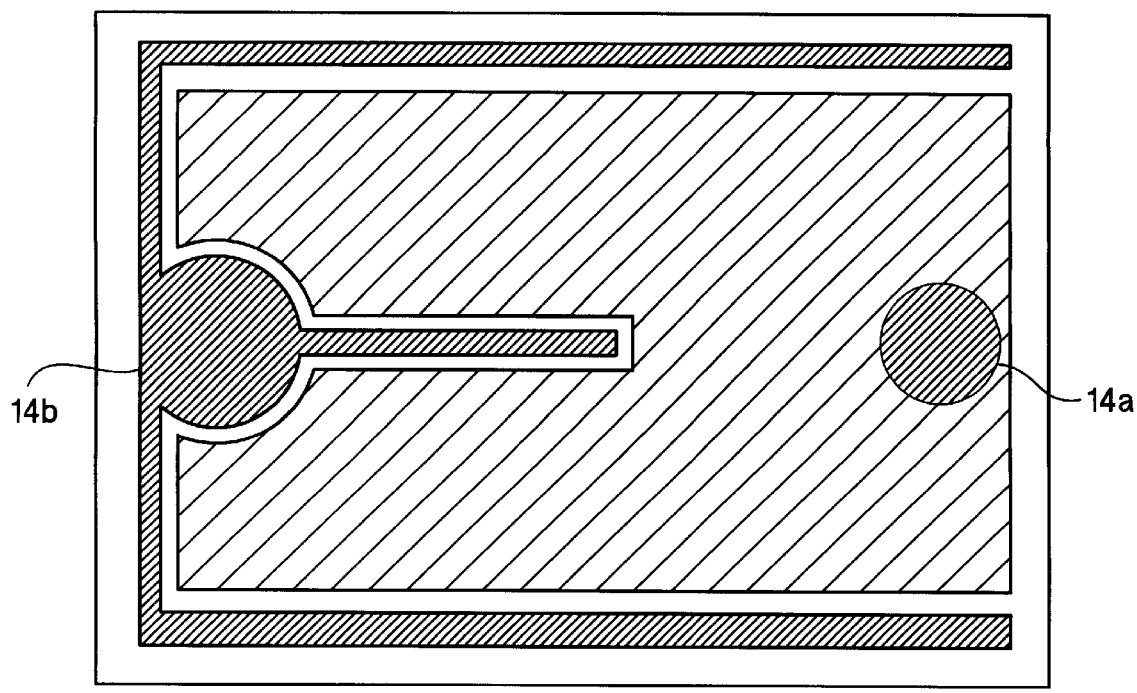
FIGS. 17A–B illustrate alternate embodiments of the present invention.
Figure 17B:
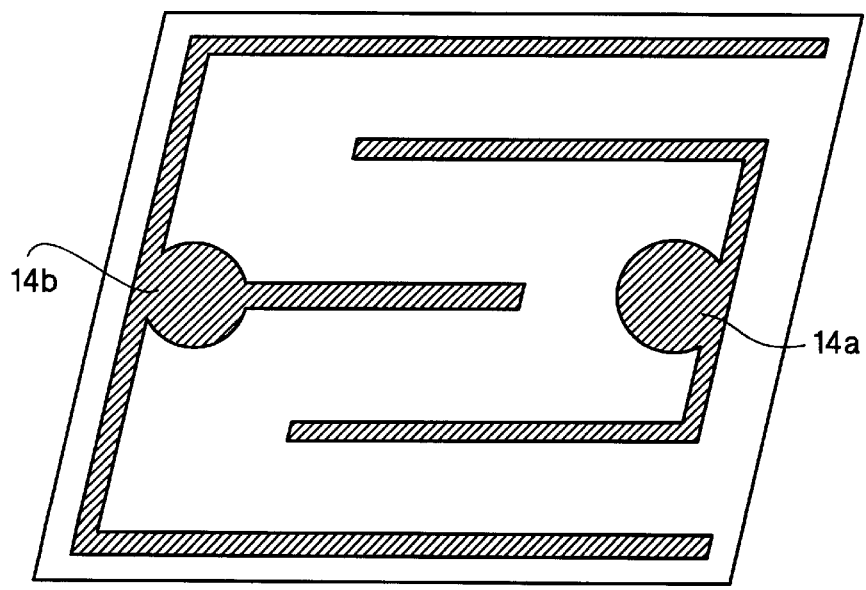

Although the embodiments detailed in FIGS. 9 and 13 are shown for specific substrate sizes and shapes, straightforward process and design considerations could be used to fabricate LEDs in a wide range, consistent with present manufacturing abilities. FIGS. 17A–B display alternate embodiments of the present invention.

Figure 18:
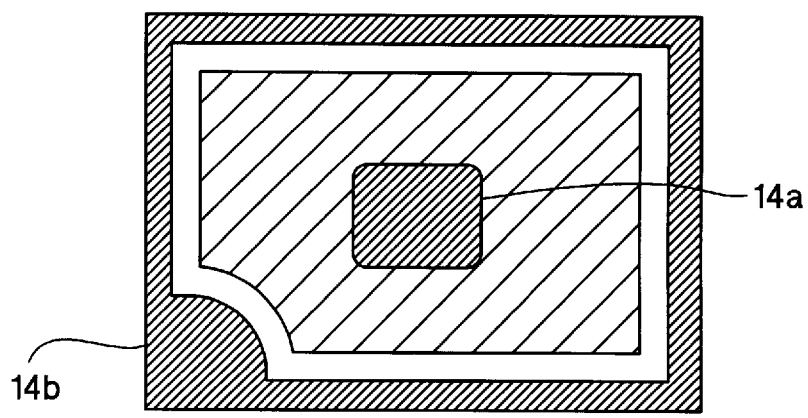
FIG. 18 illustrates an alternate embodiment having an outer electrode that completely enclosed the light-emitting region.

FIG. 18 displays a device according to the present invention having a compound electrode connected to the n-type semiconductor layer fully encompasses all four sides of the peripheral of the rectangular substrate. This n-electrode is referred to as an outer or fully enclosing electrode, and includes a single connection pad. A second compound electrode is connected to the p-type semiconductor layers. It consists of a semi-transparent metallic layer to spread the current over a majority of the light-emitting region and a single connection pad. The connection pads in this embodiment are intended for wire bonding and have a diameter of 0.1 mm. The light-emitting region is fully enclosed within the outer electrode. Other embodiments may include multiple connection pads.

Figure 19:
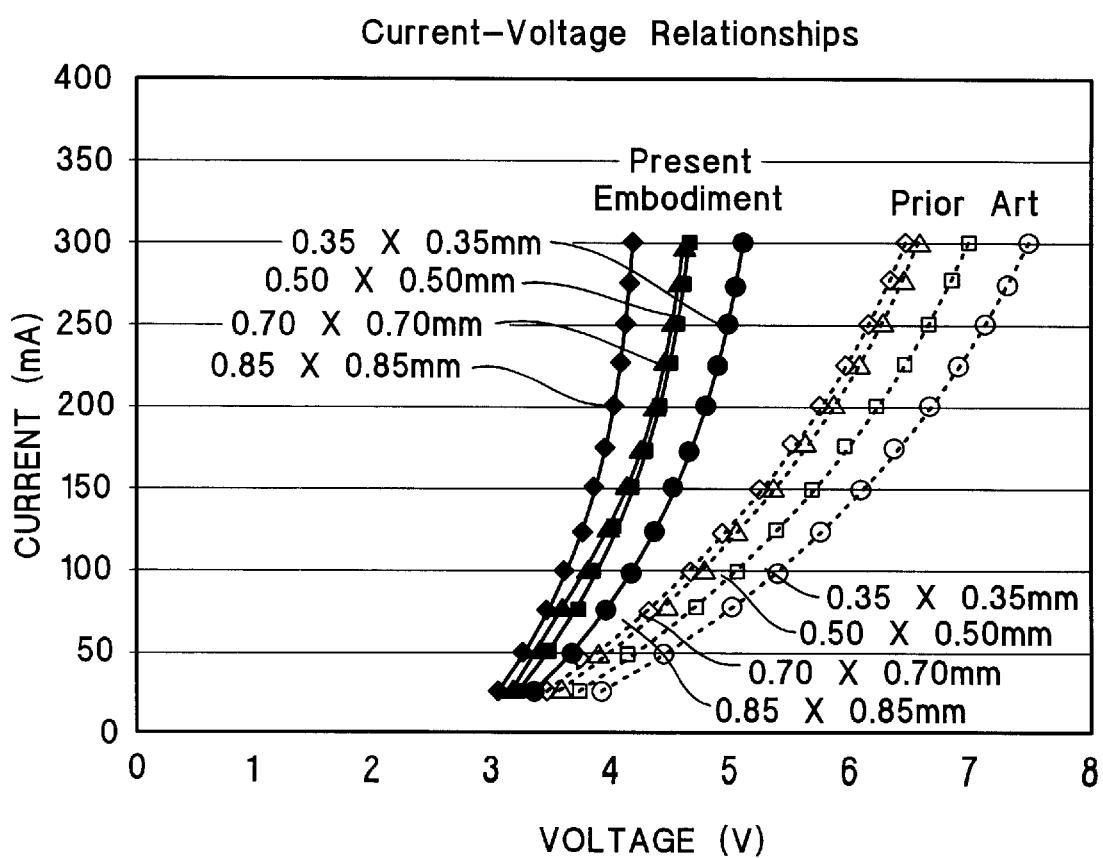
FIG. 19 compares the I-V curves for LEDs shown in FIGS. 1 and 18.

The fully enclosing outer electrode improves the uniformity of current density, and decreases the series resistance of the LED. FIG. 19 displays a plot of the I-V relationship for the devices of FIGS. 1 and 18 with four different substrate sizes. The substrate sizes: 0.35×0.35 mm², 0.50×0.50 mm², 0.70×0.70 mm², and 0.85×0.85 mm². The devices of FIG. 18 all display a reduced operating voltage at all currents greater than 20 mA, and a substantially smaller series resistance than the same size devices manufactured with geometry as shown in FIG. 1. Values of the forward voltage at 200 mA and series resistance are 4.0 V and 3.6Ω for the device of FIG. 18 on a 0.85×0.85 mm² substrate, and 5.5 V and 10Ω for the device of FIG. 1 having the same dimensions.

Figure 20:
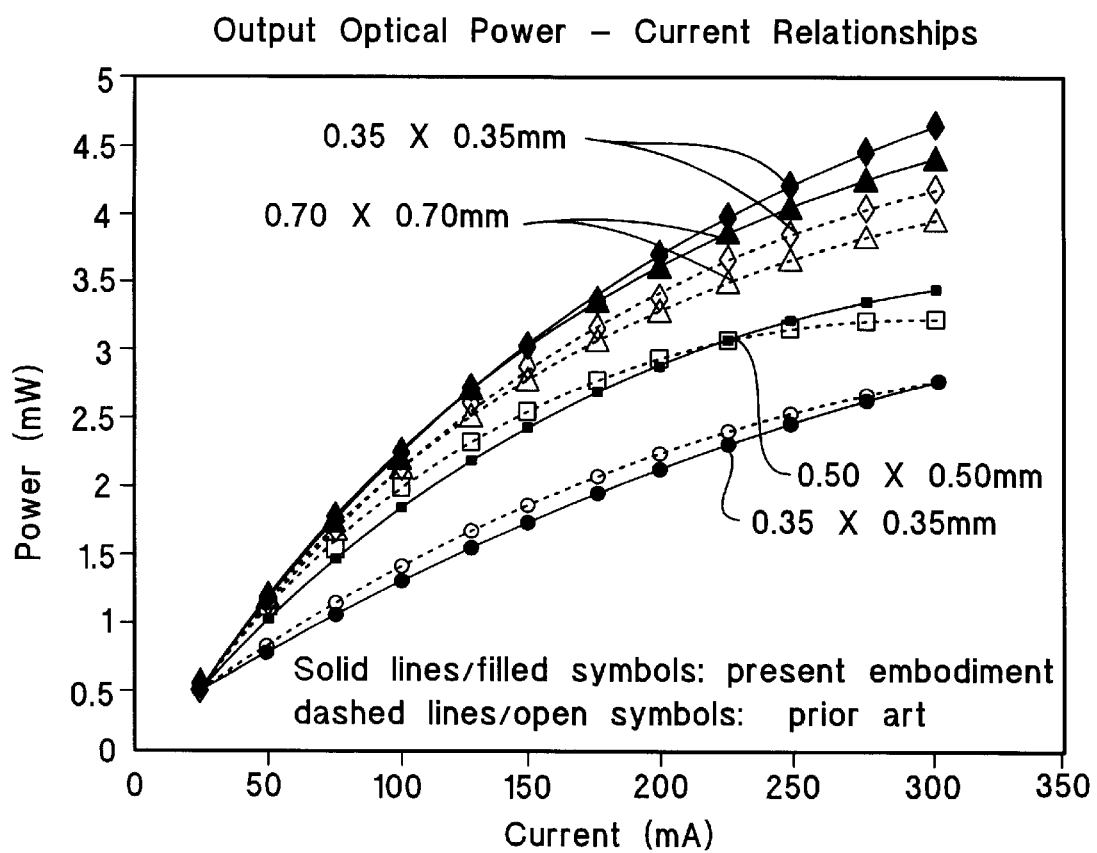
FIG. 20 compares the optical P-I curve for LEDs shown in FIGS. 1 and 18.
Figure 21A:
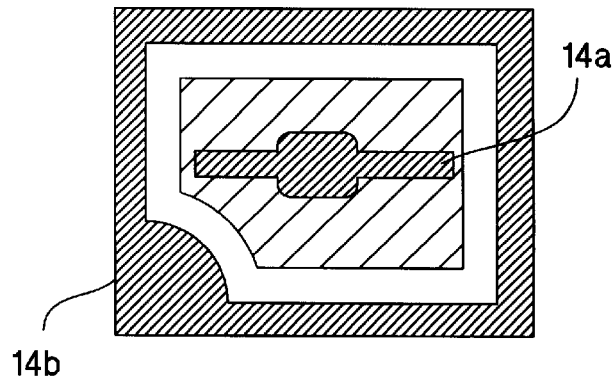
FIGS. 21A–C illustrate alternate embodiments of the present invention.
Figure 21B:
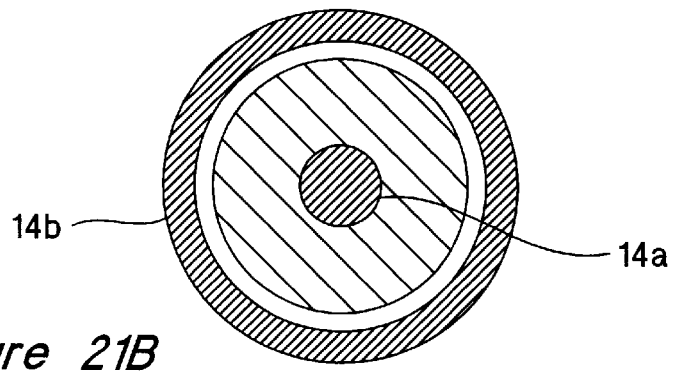
Figure 21C:
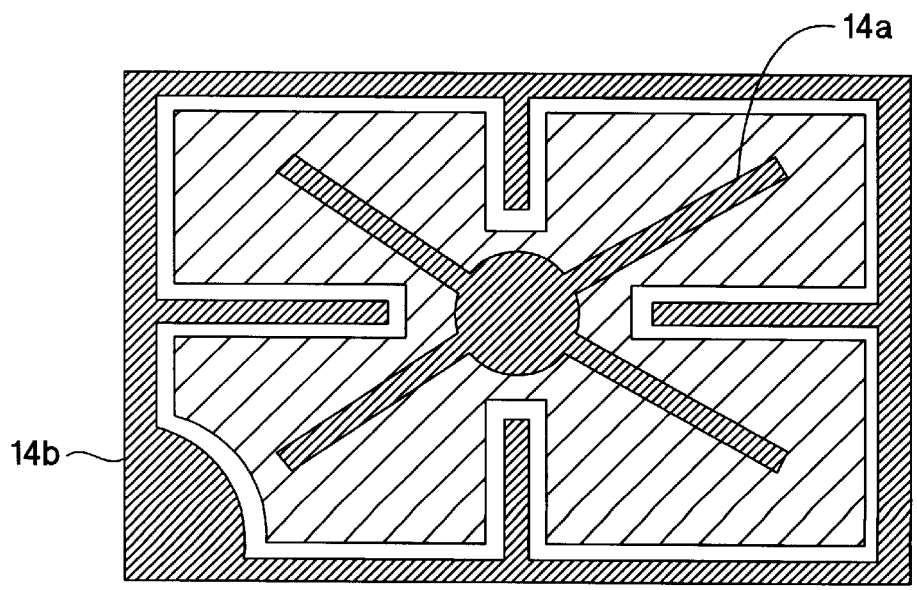

The fully enclosing outer electrode of FIG. 18 improves the uniformity of current density and the output optical power of devices with a minimum substrate size. FIG. 20 displays a plot of the optical output power—current relationship (P-I) for the devices of FIGS. 1 and 18 for four substrate sizes. All devices were encapsulated in the same type of epoxy package. Above 150 mA, the two largest devices of FIG. 18 clearly emit more optical output power than the two largest devices of FIG. 1. This increase in optical output power is due to the improved uniformity of current density of the device in shown in FIG. 18 when contrasted to that of device of FIG. 1. FIGS. 21A–C display alternate embodiments of the present invention. For the purposes of this invention, projections are considered to be single or multiple connected electrodes of arbitrary shape.

Figure 22A:
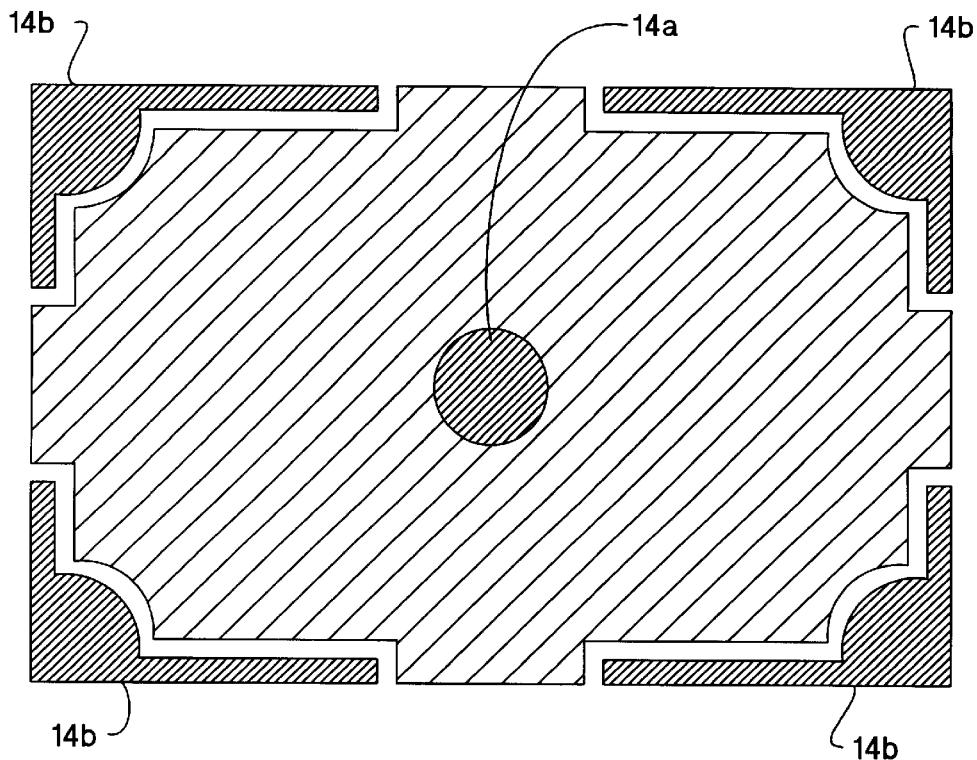
FIGS. 22A–B illustrate alternate embodiments having a segmented outer electrode.
Figure 22B:
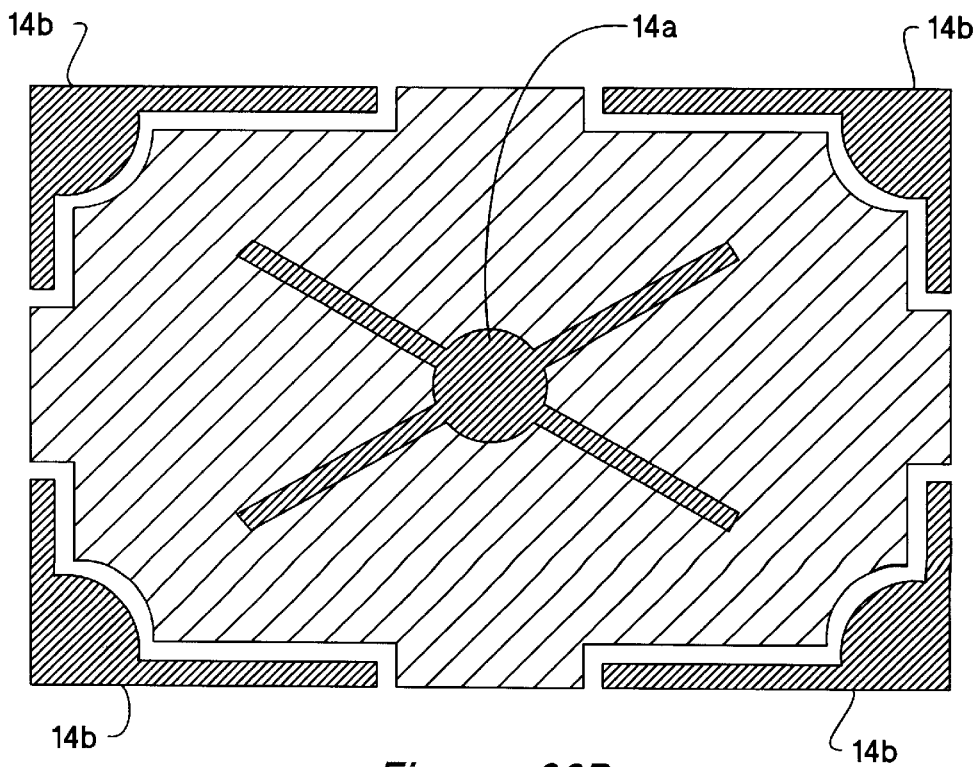
Figure 23A:
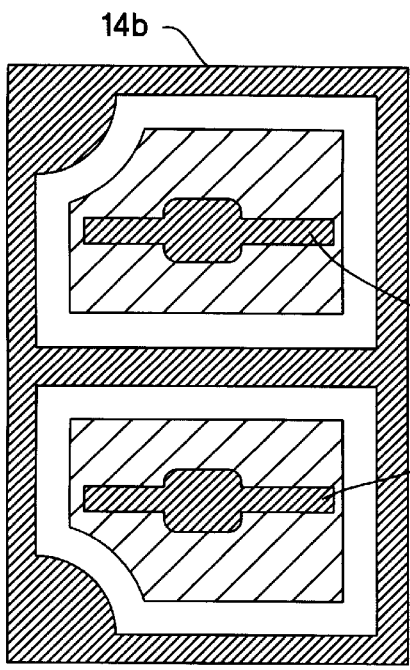
FIGS. 23A–D illustrate embodiments of the present invention wherein multiple, isolated LEDs are contained and connected in various series and parallel methods.
Figure 23B:
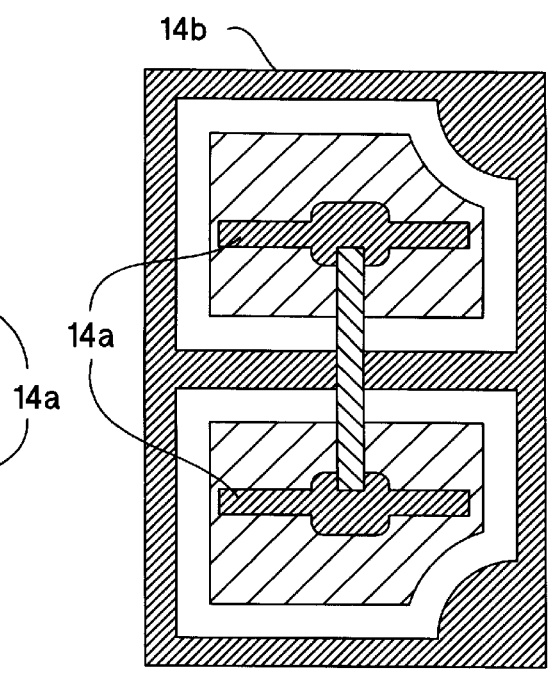
Figure 23C:
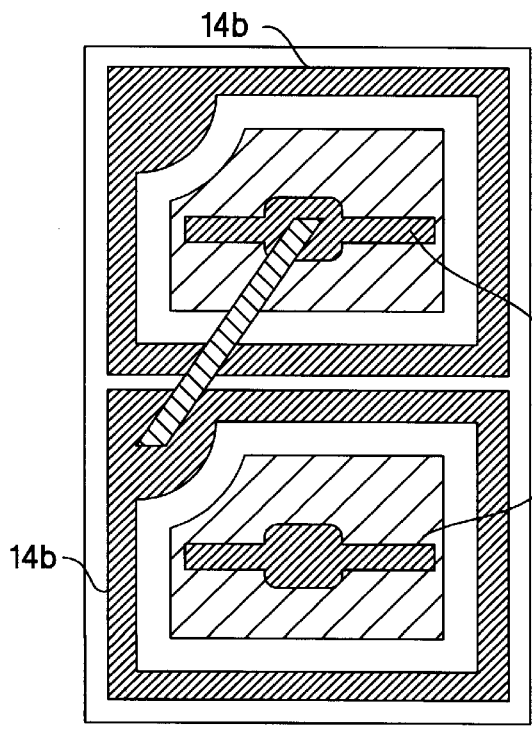
Figure 23D:
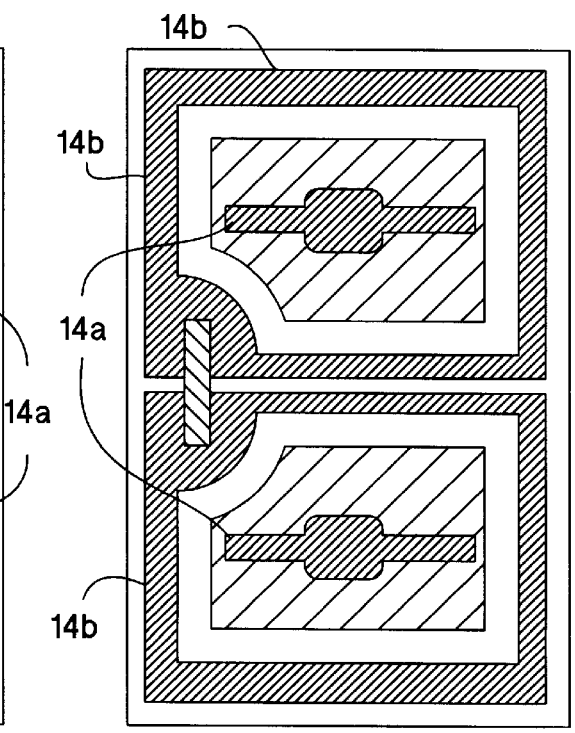

FIGS. 22A–B displays alternate embodiments of the present invention having multiple compound electrodes connected to the n-type semiconductor. Each compound electrode includes arms to improve uniform current spreading, and attached connection pads. This multiplicity of n-electrodes is referred to as segmented outer electrode. A second compound electrode is connected to the p-type semiconductor layer. It consists of a semi-transparent metallic layer to spread the current over a majority of the light-emitting region and a single connection pad. The connection pads may be wire bonded and have a diameter of 0.1 mm. The light-emitting region is fully enclosed within the projection of the outer electrode. The segmented outer electrode provides optimal uniform current spreading consistent with a minimum amount of opaque material that reduces the optical efficiency of the LED.

FIGS. 23A–D display alternate embodiments of the present invention having multiple independent light-emitting regions contained on the same substrate, and electrically connected in various manners to provide for a wide range of I-V relationships. The connecting metallization may be manufactured by a multiple level fabrication technique. This geometry allows the realization of devices with arbitrary incremental unit areas using the same wafer fabrication processes.

We claim:

1. A light emitting device comprising:
    a device structure of an AlInGaN material system, the device having a top surface, the top surface comprising a light emitting region covering at least 60% of a total area of the top surface;
    a heterojunction within the device structure, the heterojunction comprising a p-type and an n-type semiconductor layer; and
    a p-electrode and an n-electrode positioned on the top surface, the p-electrode being electrically connected to the p-type semiconductor layer, the n-electrode being electrically connected to the n-type semiconductor layer, one of the p-electrode and the n-electrode having a varying width.

2. A light emitting device, as defined in claim 1, wherein a length of one of the p-electrode and the n-electrode is ≧65% of a length of one side of the top surface.

3. A light emitting device, as defined in claim 1, wherein:
    the top surface of the device structure is a polygon; and
    a length of one of the p-electrode and the n-electrode is ≧65% of a length of each of at least two sides of the polygon.

4. A light emitting device, as defined in claim 3, wherein the inner contours of the p-electrode and the n-electrode are parallel to the sides of the polygon.

5. A light emitting device, as defined in claim 3, wherein the inner contours of the p-electrode and the n-electrode are parallel to each other.

6. A light emitting device, as defined in claim 3, wherein the polygon is selected from a group consisting of squares, hexagons, octagons, rectangles, trapezoids, and parallelograms.

7. A light emitting device, as defined in claim 3, each of the p-electrode and the n-electrode further comprising:
    a wire bonding area, positioned at a first end of the electrode; and
    a second end of the electrode opposite the first end, wherein the second end is narrower than the first end.

8. A light emitting device, as defined in claim 1, wherein:
    a shape of the top surface is selected from a group consisting of circles, ellipses, and ovals; and
    at least one of the p-electrode and the n-electrode has a length that is ≧25% of a peripheral length of the top surface.

9. A light emitting device, as defined in claim 1, wherein:
    one of the p-electrode and the n-electrode is an enclosing electrode having a shape that encloses 100% of the light emitting region.

10. A light emitting device, as defined in claim 9, wherein the shape of an outside edge of the enclosing electrode is selected from a group consisting of rectangles, circles, squares, parallelograms, ellipses, and ovals.

11. A light emitting device, as defined in claim 9, wherein the shape of an inside edge of the enclosing electrode includes projections operative to spread current in a corresponding semiconductor layer.

12. A light emitting device, as defined in claim 1, further comprising multiple n and p electrodes, positioned to define Q electrically connected regions, $Q \geq 2$, and enclose the light emitting area.

13. A light emitting device, as defined in claim 12, wherein the Q electrically connected regions are connected using multilevel metallization.

14. A light emitting device comprising:
- a device structure of an AlInGaN material system, the device structure having a top surface;
- a heterojunction within the device structure the heterojunction comprising a p-type and an n-type semiconductor layer; and
- a p-electrode and an n-electrode positioned on the top surface, the p-electrode being electrically connected to the p-type semiconductor layer and the n-electrode being electrically connected to the n-type semiconductor layer;
- one of the p-electrode and the n-electrode comprising two outer arms and N inner arms, where $N \geq 0$, and a cross beam connecting the two outer and N inner arms.

15. A light emitting device, as defined in claim 14, further comprising connection pads interposing the two outer and N inner arms.

16. A light emitting device, as defined in claim 15, wherein the other of the p-electrode and the n-electrode is shaped as a fork having M tines, where $M \geq 1$.

17. A light-emitting device, as defined in claim 16, wherein the M tines interpose the two outer and N inner arms.

18. A light emitting device, as defined in claim 17, wherein the distance between the N inner arms and the M tines is constant.

19. A light emitting device, as defined in claim 1, wherein the area of the device structure is $\geq 0.2 \text{mm}^2$.

20. A light emitting device, as defined in claim 9, wherein the area of the device structure is $> 0.2 \text{mm}^2$.

21. A light emitting device, as defined claim 14, further comprising:
- an area utilization ratio, of at least 60%, defined as the ratio of the area of the light emitting region to the total area of the device structure; and
- wherein the area of the device structure is $\geq 0.2 \text{ mm}^2$.

22. A light emitting device, as defined in claim 21, further comprising connection pads interposing the two outer and N inner arms.

23. A light emitting device, as defined in claim 21, wherein the other of the p and n electrodes is shaped as a fork having M tines, where $M \geq 1$.

24. A light-emitting device, as defined in claim 23, wherein the M tines interpose the two outer and N inner arms.

25. A light emitting device, as defined in claim 24, wherein the distance between the N inner arms and the M tines is constant.

26. The light emitting device of claim 9 wherein the other of the p-electrode and the n-electrode is within an enclosure formed by the enclosing electrode.

27. The light emitting device of claim 14 wherein a length of at least one of the outer arms is substantially equal to a length of an edge of the heterojunction.

28. A light emitting device, comprising:
- a device structure of an AlInGaN material system, the device structure having a top surface;
- a heterojunction within the device structure, the heterojunction comprising a p-type and an n-type semiconductor layer; and
- a p-electrode and an n-electrode positioned on the top surface, the p-electrode being electrically connected to the p-type semiconductor layer and the n-electrode being electrically connected to the n-type semiconductor layer, the p-electrode further comprising an outer edge located proximate a first boundary of the top surface and a curved edge opposite the outer edge of the p-electrode, and the n-electrode further comprising an outer edge located proximate a second boundary of the top surface and a curved edge opposite the outer edge of the n-electrode;
- wherein the first boundary and the second boundary are substantially parallel.

29. The light emitting device of claim 28 wherein a shortest distance between any point on the curved edge of the p-electrode and the n-electrode is constant.

30. The light emitting device of claim 29 wherein said shortest distance is less than a length of at least one edge of the p-electrode.

31. The light emitting device of claim 28 wherein a shape and an area of the p-electrode and the n-electrode are substantially equal.

32. The light emitting device of claim 28 wherein the n-electrode and the p-electrode have a length substantially equal to a length of the heterojunction.

33. A light emitting device comprising:
- a device structure of an AlInGaN material system, the device structure having a top surface;
- a heterojunction within the device structure, the heterojunction comprising a p-type and an n-type semiconductor layer; and
- a p-electrode and an n-electrode positioned on the top surface, the p-electrode being electrically connected to the p-type semiconductor layer and the n-electrode being electrically connected to the n-type semiconductor layer;
- wherein one of the p-electrode and the n-electrode comprises two outer arms and a crossbeam connecting the two outer arms and the other of the p-electrode and the n-electrode is located between the two outer arms.

34. The light emitting device of claim 33 wherein the crossbeam has a curved edge.

35. The light emitting device of claim 33 wherein the other of the p-electrode and the n-electrode shaped like a circle.

36. The light emitting device of claim 33 wherein one of the outer arms has a length substantially equal to a length of the heterojunction.

* * * * *